US010153788B2

(12) United States Patent
Cideciyan et al.

(10) Patent No.: US 10,153,788 B2
(45) Date of Patent: Dec. 11, 2018

(54) DETECTION OF MULTIPLE BIT ERRORS IN RANDOM ACCESS MEMORIES

(71) Applicant: International Business Machines Corporation, Armonk, NY (US)

(72) Inventors: Roy D. Cideciyan, Rueschlikon (CH); Mark A. Lantz, Adliswil (CH); Scott J. Schaffer, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 76 days.

(21) Appl. No.: 15/140,311

(22) Filed: Apr. 27, 2016

(65) Prior Publication Data

US 2017/0315862 A1 Nov. 2, 2017

(51) Int. Cl.
*G11C 29/00* (2006.01)
*H03M 13/00* (2006.01)
*G11C 29/52* (2006.01)
*H03M 13/15* (2006.01)

(52) U.S. Cl.
CPC ........... *H03M 13/616* (2013.01); *G11C 29/52* (2013.01); *H03M 13/1575* (2013.01)

(58) Field of Classification Search
CPC .. G06F 11/1004; G06F 11/1068; G11C 29/52; H03M 13/1575; H03M 13/616
See application file for complete search history.

(56) References Cited

U.S. PATENT DOCUMENTS

| 4,928,280 A | 5/1990 | Nielson et al. |
| 5,343,481 A * | 8/1994 | Kraft .................... H03M 13/00 714/782 |
| 6,536,009 B1 | 3/2003 | Bodnar |
| 7,249,309 B2 | 7/2007 | Glaise et al. |
| 8,443,255 B2 | 5/2013 | Jiang et al. |
| 8,887,026 B2 | 11/2014 | Bremler-Barr et al. |
| 9,094,047 B2 | 7/2015 | Litsyn et al. |
| 2014/0053045 A1 | 2/2014 | Resnick |

(Continued)

OTHER PUBLICATIONS

Narasimham et al., "A Multi-Bit Error Detection Scheme for DRAM Using Partial Sums with Parallel Counters," IEEE International Reliability Physics Symposium (IRPS), 2008, pp. 202-205.

(Continued)

*Primary Examiner* — Samir W Rizk
(74) *Attorney, Agent, or Firm* — Zilka-Kotab, P.C.

(57) ABSTRACT

In one embodiment, a method includes reading a codeword stored to a memory, computing a syndrome word based on a product of the codeword and a parity check matrix derived from a linear block code, setting a flag to a first value indicating that the codeword includes no errors in response to a first determination requiring that the syndrome word is an all-zero vector, setting the flag to a second value indicating that the codeword includes exactly one single-bit error in response to a second determination requiring that the syndrome word equals a column of the parity check matrix, setting the flag to a third value indicating that the codeword includes an odd number of multiple bit errors in response to a third determination, and setting the flag to a fourth value indicating that the codeword includes an even number of multiple bit errors in response to a fourth determination.

25 Claims, 9 Drawing Sheets

(56) References Cited

U.S. PATENT DOCUMENTS

2014/0181618 A1* 6/2014 Wu .................. H03M 13/11
  714/761
2015/0007001 A1* 1/2015 Kern ................ H03M 13/152
  714/785

OTHER PUBLICATIONS

Slayman Charles, "Soft Error Trends and Mitigation Techniques in Memory Devices," Ops A La Carte, 2011, pp. 1-5.

* cited by examiner

DETECTION OF MULTIPLE BIT ERRORS IN RANDOM ACCESS MEMORIES

BACKGROUND

The present invention relates to data storage systems, and more particularly, this invention relates to detecting multiple bit errors in memories, such as random access memories.

A soft error is indicative of a system failure resulting from an electrical noise pulse caused by subatomic particles (such as high-energy neutrons, low-energy thermal neutrons, and alpha particles, etc.) traversing the silicon used to store binary data. Each particle leaves a trail of electron-hole pairs in its wake, and this charge is separated by electric fields of circuit node voltages. Therefore, free charge may be collected by circuit nodes in a very short time interval. There is no permanent damage to the circuit, as the circuit functions properly after the event. However, these soft errors in circuits and memories change the logic state from 0 to 1 or from 1 to 0, resulting in data errors.

SUMMARY

In one embodiment, a system includes a processing circuit and logic integrated with and/or executable by the processing circuit to cause the processing circuit to read a codeword stored to a memory. The codeword is a vector of binary symbols having a predetermined length, the codeword of length n bits is encoded from a linear block code applied to a data word of length k bits, the linear block code is configured to provide m+1 bits of parity for each data word, with $n=2^m-u$, $k=2^m-1-m-u$, and m and u are user selectable positive integer parameters. The logic further causes the processing circuit to compute a syndrome word based on a product of the codeword and a parity check matrix derived from the linear block code and set a flag to a first value indicating that the codeword includes no errors in response to a first determination requiring that the syndrome word is an all-zero vector. The logic also causes the processing circuit to set the flag to a second value indicating that the codeword includes exactly one single-bit error in response to a second determination requiring that the syndrome word equals a column of the parity check matrix and set the flag to a third value indicating that the codeword includes an odd number of multiple bit errors in response to a third determination. Moreover, the logic causes the processing circuit to set the flag to a fourth value indicating that the codeword includes an even number of multiple bit errors in response to a fourth determination and output the flag corresponding to an estimated number of bit errors in the codeword.

In another embodiment, a computer program product includes a computer readable storage medium having program instructions embodied therewith. The computer readable storage medium is not a transitory signal per se, and the program instructions are executable by a processing circuit to cause the processing circuit to read, by the processing circuit, a codeword stored to a memory. The codeword is a vector of binary symbols having a predetermined length, the codeword of length n bits is encoded from a linear block code applied to a data word of length k bits, the linear block code is configured to provide m+1 bits of parity for each data word, with $n=2^m-u$, $k=2^m-1-m-u$, and m and u are user selectable positive integer parameters. The program instructions are also executable by the processing circuit to cause the processing circuit to compute, by the processing circuit, a syndrome word based on a product of the codeword and a parity check matrix derived from the linear block code, and set, by the processing circuit, a flag to a first value indicating that the codeword includes no errors in response to a first determination requiring that the syndrome word is an all-zero vector, The program instructions are further executable by the processing circuit to cause the processing circuit to set, by the processing circuit, the flag to a second value indicating that the codeword includes exactly one single-bit error in response to a second determination requiring that the syndrome word equals a column of the parity check matrix, and set, by the processing circuit, the flag to a third value indicating that the codeword includes an odd number of multiple bit errors in response to a third determination. Moreover, the program instructions are executable by the processing circuit to cause the processing circuit to set, by the processing circuit, the flag to a fourth value indicating that the codeword includes an even number of multiple bit errors in response to a fourth determination, and output, by the processing circuit, the flag corresponding to an estimated number of bit errors in the codeword.

In another embodiment, a computer-implemented method includes reading a codeword stored to a memory. The codeword is a vector of binary symbols having a predetermined length, the codeword of length n bits is encoded from a linear block code applied to a data word of length k bits, the linear block code is configured to provide m+1 bits of parity for each data word, with $n=2^m-u$, $k=2^m-1-m-u$, and m and u are user selectable positive integer parameters. The method also includes computing a syndrome word based on a product of the codeword and a parity check matrix derived from the linear block code and setting a flag to a first value indicating that the codeword includes no errors in response to a first determination requiring that the syndrome word is an all-zero vector. The method further includes setting the flag to a second value indicating that the codeword includes exactly one single-bit error in response to a second determination requiring that the syndrome word equals a column of the parity check matrix, and setting the flag to a third value indicating that the codeword includes an odd number of multiple bit errors in response to a third determination. Moreover, the method includes setting the flag to a fourth value indicating that the codeword includes an even number of multiple bit errors in response to a fourth determination, and outputting the flag corresponding to an estimated number of bit errors in the codeword.

In yet another embodiment, a system includes a processing circuit and logic integrated with and/or executable by the processing circuit to cause the processing circuit to read a codeword stored to a memory. The codeword is a vector of binary symbols having a predetermined length, the codeword of length n bits is encoded from a linear block code applied to a data word of length k bits, the linear block code is configured to provide m+1 bits of parity for each data word, with $n=2^m-u$, $k=2^m-1-m-u$, and m and u are user selectable positive integer parameters. The logic further causes the processing circuit to compute a syndrome word based on a product of the codeword and a parity check matrix derived from the linear block code, the parity check matrix having (n–k) linearly independent rows and n columns, with a last element of each column from the parity check matrix equaling one, and a first n–k–1 elements of any two columns from the parity check matrix not being equivalent. The logic also causes the processing circuit to set a flag to a first value indicating that the codeword includes no errors in response to a first determination requiring that the syndrome word is an all-zero vector. The logic causes the processing circuit to set the flag to a second value indicating that the codeword includes exactly one single-bit error in response to a second determination requiring that the syndrome word equals a column of the parity check matrix and set the flag to a third value indicating that the codeword includes an odd number of multiple bit errors in response to a third determination requiring that a last element of the syndrome word is equal to one, the third value indicating that the codeword includes three bit errors. Moreover, the logic causes the processing circuit to set the flag to a fourth value indicating that the codeword includes an even number of multiple bit errors in response to a fourth determination requiring absence of the first, second, or third determinations, the fourth value indicating that the codeword includes two bit errors. The logic also causes the processing circuit to output the flag corresponding to an estimated number of bit errors in the codeword.

In accordance with another embodiment, a system includes a processing circuit and logic integrated with and/or executable by the processing circuit to cause the processing circuit to read a codeword stored to a memory. The codeword is a vector of binary symbols having a predetermined length, the codeword of length n bits is encoded from a linear block code applied to a data word of length k bits, the linear block code is configured to provide m+1 bits of parity for each data word, with $n=2^m-u$, $k=2^m-1-m-u$, and m and u are user selectable positive integer parameters. The logic further causes the processing circuit to compute a syndrome word based on a product of the codeword and a parity check matrix derived from the linear block code, the parity check matrix having (n−k) linearly independent rows and n columns, with no column in the parity check matrix being an all-zero vector, no two columns from the parity check matrix being equivalent, and an odd number of elements in each column of the parity check matrix equaling one. The logic also causes the processing circuit to set a flag to a first value indicating that the codeword includes no errors in response to a first determination requiring that the syndrome word is an all-zero vector. The logic also causes the processing circuit to set the flag to a second value indicating that the codeword includes exactly one single-bit error in response to a second determination requiring that the syndrome word equals a column of the parity check matrix. Moreover, the logic causes the processing circuit to set the flag to a third value indicating that the codeword includes an odd number of multiple bit errors in response to a third determination requiring that binary summation of all elements in the syndrome word equals one, the third value indicating that the codeword includes three bit errors. Also, the logic causes the processing circuit to set the flag to a fourth value indicating that the codeword includes an even number of multiple bit errors in response to a fourth determination requiring absence of the first, second, or third determinations, the fourth value indicating that the codeword includes two bit errors, and output the flag corresponding to an estimated number of bit errors in the codeword.

Other aspects and embodiments of the present invention will become apparent from the following detailed description, which, when taken in conjunction with the drawings, illustrate by way of example the principles of the invention.

DETAILED DESCRIPTION

Figure 1:
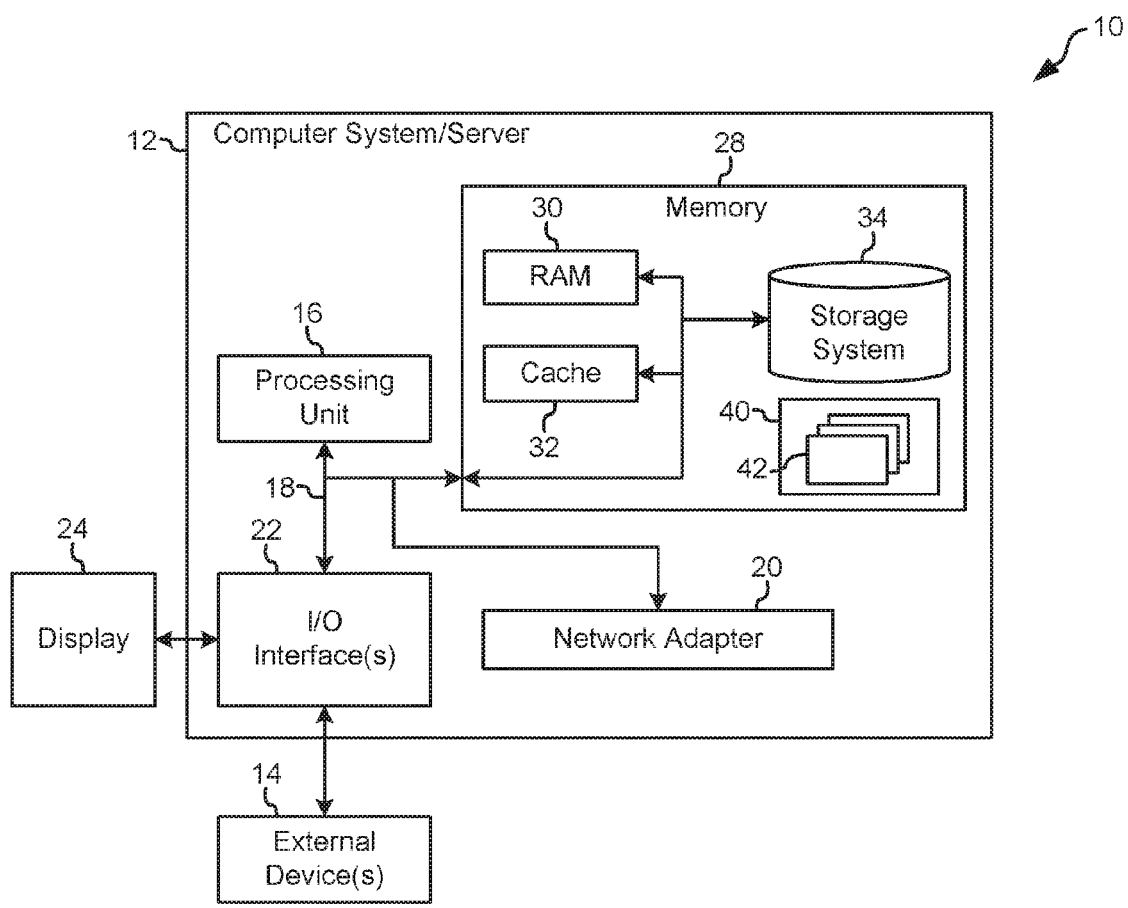
FIG. 1 illustrates a network storage system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "about" as used herein indicates the value preceded by the term "about," along with any values reasonably close to the value preceded by the term "about," as would be understood by one of skill in the art. When not indicated otherwise, the term "about" denotes the value preceded by the term "about"±10% of the value. For example, "about 10" indicates all values from and including 9.0 to 11.0.

The following description discloses several preferred embodiments of systems, methods, and computer program products configured to correct single bit errors and detect multiple odd and even numbers of bit errors in codewords stored in memory, such as random access memory (RAM).

In one general embodiment, a system includes a processing circuit and logic integrated with and/or executable by the processing circuit to cause the processing circuit to read a codeword stored to a memory. The codeword is a vector of binary symbols having a predetermined length, the codeword of length n bits is encoded from a linear block code applied to a data word of length k bits, the linear block code is configured to provide m+1 bits of parity for each data word, with $n=2^m-u$, $k=2^m-1-m-u$, and m and u are user selectable positive integer parameters. The logic further causes the processing circuit to compute a syndrome word based on a product of the codeword and a parity check matrix derived from the linear block code and set a flag to a first value indicating that the codeword includes no errors in response to a first determination requiring that the syndrome word is an all-zero vector. The logic also causes the processing circuit to set the flag to a second value indicating that the codeword includes exactly one single-bit error in response to a second determination requiring that the syndrome word equals a column of the parity check matrix and set the flag to a third value indicating that the codeword includes an odd number of multiple bit errors in response to a third determination. Moreover, the logic causes the processing circuit to set the flag to a fourth value indicating that the codeword includes an even number of multiple bit errors in response to a fourth determination and output the flag corresponding to an estimated number of bit errors in the codeword.

In another general embodiment, a computer program product includes a computer readable storage medium having program instructions embodied therewith. The computer readable storage medium is not a transitory signal per se, and the program instructions are executable by a processing circuit to cause the processing circuit to read, by the processing circuit, a codeword stored to a memory. The codeword is a vector of binary symbols having a predetermined length, the codeword of length n bits is encoded from a linear block code applied to a data word of length k bits, the linear block code is configured to provide m+1 bits of parity for each data word, with $n=2^m-u$, $k=2^m-1-m-u$, and m and u are user selectable positive integer parameters. The program instructions are also executable by the processing circuit to cause the processing circuit to compute, by the processing circuit, a syndrome word based on a product of the codeword and a parity check matrix derived from the linear block code, and set, by the processing circuit, a flag to a first value indicating that the codeword includes no errors in response to a first determination requiring that the syndrome word is an all-zero vector, The program instructions are further executable by the processing circuit to cause the processing circuit to set, by the processing circuit, the flag to a second value indicating that the codeword includes exactly one single-bit error in response to a second determination requiring that the syndrome word equals a column of the parity check matrix, and set, by the processing circuit, the flag to a third value indicating that the codeword includes an odd number of multiple bit errors in response to a third determination. Moreover, the program instructions are executable by the processing circuit to cause the processing circuit to set, by the processing circuit, the flag to a fourth value indicating that the codeword includes an even number of multiple bit errors in response to a fourth determination, and output, by the processing circuit, the flag corresponding to an estimated number of bit errors in the codeword.

In another general embodiment, a computer-implemented method includes reading a codeword stored to a memory. The codeword is a vector of binary symbols having a predetermined length, the codeword of length n bits is encoded from a linear block code applied to a data word of length k bits, the linear block code is configured to provide m+1 bits of parity for each data word, with $n=2^m-u$, $k=2^m-1-m-u$, and m and u are user selectable positive integer parameters. The method also includes computing a syndrome word based on a product of the codeword and a parity check matrix derived from the linear block code and setting a flag to a first value indicating that the codeword includes no errors in response to a first determination requiring that the syndrome word is an all-zero vector. The method further includes setting the flag to a second value indicating that the codeword includes exactly one single-bit error in response to a second determination requiring that the syndrome word equals a column of the parity check matrix, and setting the flag to a third value indicating that the codeword includes an odd number of multiple bit errors in response to a third determination. Moreover, the method includes setting the flag to a fourth value indicating that the codeword includes an even number of multiple bit errors in response to a fourth determination, and outputting the flag corresponding to an estimated number of bit errors in the codeword.

In yet another general embodiment, a system includes a processing circuit and logic integrated with and/or executable by the processing circuit to cause the processing circuit to read a codeword stored to a memory. The codeword is a vector of binary symbols having a predetermined length, the codeword of length n bits is encoded from a linear block code applied to a data word of length k bits, the linear block code is configured to provide m+1 bits of parity for each data word, with $n=2^m-u$, $k=2^m-1-m-u$, and m and u are user selectable positive integer parameters. The logic further causes the processing circuit to compute a syndrome word based on a product of the codeword and a parity check matrix derived from the linear block code, the parity check matrix having (n−k) linearly independent rows and n columns, with a last element of each column from the parity check matrix equaling one, and a first n−k−1 elements of any two columns from the parity check matrix not being equivalent. The logic also causes the processing circuit to set a flag to a first value indicating that the codeword includes no errors in response to a first determination requiring that the syndrome word is an all-zero vector. The logic causes the processing circuit to set the flag to a second value indicating that the codeword includes exactly one single-bit error in response to a second determination requiring that the syndrome word equals a column of the parity check matrix and set the flag to a third value indicating that the codeword includes an odd number of multiple bit errors in response to a third determination requiring that a last element of the syndrome word is equal to one, the third value indicating that the codeword includes three bit errors. Moreover, the logic causes the processing circuit to set the flag to a fourth value indicating that the codeword includes an even number of multiple bit errors in response to a fourth determination requiring absence of the first, second, or third determinations, the fourth value indicating that the codeword includes two bit errors. The logic also causes the processing circuit to output the flag corresponding to an estimated number of bit errors in the codeword.

In accordance with another general embodiment, a system includes a processing circuit and logic integrated with and/or executable by the processing circuit to cause the processing circuit to read a codeword stored to a memory. The codeword is a vector of binary symbols having a predetermined length, the codeword of length n bits is encoded from a linear block code applied to a data word of length k bits, the linear block code is configured to provide m+1 bits of parity for each data word, with $n=2^m-u$, $k=2^m-1-m-u$, and m and u are user selectable positive integer parameters. The logic further causes the processing circuit to compute a syndrome word based on a product of the codeword and a parity check matrix derived from the linear block code, the parity check matrix having (n−k) linearly independent rows and n columns, with no column in the parity check matrix being an all-zero vector, no two columns from the parity check matrix being equivalent, and an odd number of elements in each column of the parity check matrix equaling one. The logic also causes the processing circuit to set a flag to a first value indicating that the codeword includes no errors in response to a first determination requiring that the syndrome word is an all-zero vector. The logic also causes the processing circuit to set the flag to a second value indicating that the codeword includes exactly one single-bit error in response to a second determination requiring that the syndrome word equals a column of the parity check matrix. Moreover, the logic causes the processing circuit to set the flag to a third value indicating that the codeword includes an odd number of multiple bit errors in response to a third determination requiring that binary summation of all elements in the syndrome word equals one, the third value indicating that the codeword includes three bit errors. Also, the logic causes the processing circuit to set the flag to a fourth value indicating that the codeword includes an even number of multiple bit errors in response to a fourth determination requiring absence of the first, second, or third determinations, the fourth value indicating that the codeword includes two bit errors, and output the flag corresponding to an estimated number of bit errors in the codeword.

Referring now to FIG. 1, a schematic of a network storage system 10 is shown according to one embodiment. This network storage system 10 is only one example of a suitable storage system and is not intended to suggest any limitation as to the scope of use or functionality of embodiments of the invention described herein. Regardless, network storage system 10 is capable of being implemented and/or performing any of the functionality set forth hereinabove.

In the network storage system 10, there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in the network storage system 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 may include computer system readable media in the form of volatile memory, such as RAM 30 and/or cache memory 32. Computer system/server 12 may further include other removable/non-removable, volatile/non-volatile computer system storage media. By way of example only, storage system 34 may be provided for reading from and writing to a non-removable, non-volatile magnetic media—not shown and typically called a "hard disk," which may be operated in a HDD. Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media, a tape drive for reading from or writing to a removable tape cartridge having a magnetic tape medium stored therein, etc., may be provided. In such instances, each may be connected to bus 18 by one or more data media interfaces. As will be further depicted and described below, memory 28 may include at least one program product having a set (e.g., at least one) of program modules that are configured to carry out the functions of embodiments described herein.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication may occur via Input/Output (I/O) interfaces 22. Still yet, computer system/server 12 may communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, redundant array of independent disks (RAID) systems, tape drives, and data archival storage systems, etc.

Figure 2A:
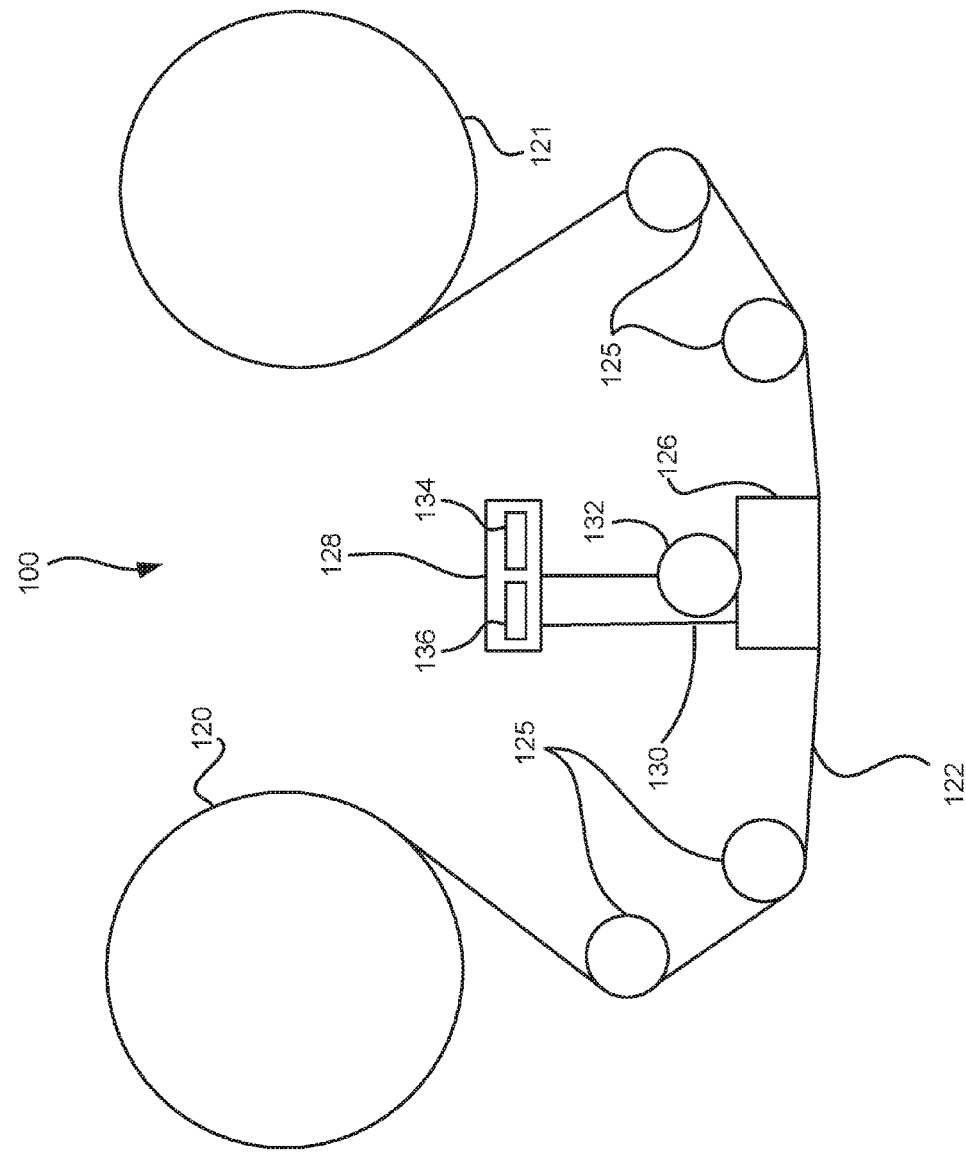
FIG. 2A shows a tape drive according to one embodiment.

FIG. 2A illustrates a simplified tape drive 100 of a tape-based data storage system, which may be employed in the context of the present invention. While one specific implementation of a tape drive is shown in FIG. 2A, it should be noted that the embodiments described herein may be implemented in the context of any type of tape drive system.

As shown, a tape supply cartridge 120 and a take-up reel 121 are provided to support a tape 122. One or more of the reels may form part of a removable cartridge and are not necessarily part of the tape drive 100. The tape drive, such as that illustrated in FIG. 2A, may further include drive motor(s) to drive the tape supply cartridge 120 and the take-up reel 121 to move the tape 122 over a tape head 126 of any type. Such head may include an array of readers, writers, or both.

Guides 125 guide the tape 122 across the tape head 126. Such tape head 126 is in turn coupled to a controller 128 via a cable 130. The controller 128, may be or include a processor and/or any logic for controlling any subsystem of the tape drive 100. For example, the controller 128 typically controls head functions such as servo following, data writing, data reading, etc. The controller 128 may include at least one servo channel and at least one data channel, each of which include data flow processing logic configured to process and/or store information to be written to and/or read from the tape 122. The controller 128 may operate under logic known in the art, as well as any logic disclosed herein, and thus may be considered as a processor for any of the descriptions of tape drives included herein, in various embodiments. The controller 128 may be coupled to a memory 136 of any known type, which may store instructions executable by the controller 128. Moreover, the controller 128 may be configured and/or programmable to perform or control some or all of the methodology presented herein. Thus, the controller 128 may be considered to be configured to perform various operations by way of logic programmed into one or more chips, modules, and/or blocks; software, firmware, and/or other instructions being available to one or more processors; etc., and combinations thereof.

The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive 100 and a host (internal or external) to send and receive the data and for controlling the operation of the tape drive 100 and communicating the status of the tape drive 100 to the host, all as will be understood by those of skill in the art.

Figure 2B:
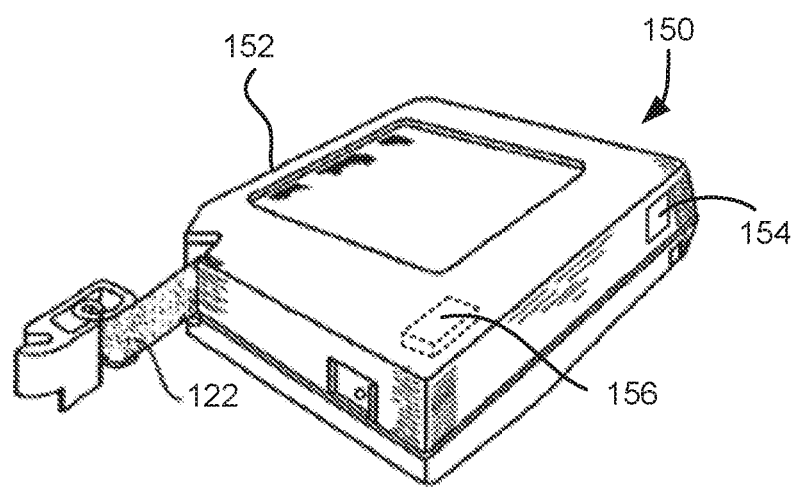
FIG. 2B shows a tape cartridge that may be used with the tape drive of FIG. 2A, according to one embodiment.

FIG. 2B illustrates an exemplary tape cartridge 150 according to one embodiment. Such tape cartridge 150 may be used with a system such as that shown in FIG. 2A. As shown, the tape cartridge 150 includes a housing 152, a tape 122 in the housing 152, and a nonvolatile memory 156 coupled to the housing 152. In some approaches, the nonvolatile memory 156 may be embedded inside the housing 152, as shown in FIG. 2B. In more approaches, the nonvolatile memory 156 may be attached to the inside or outside of the housing 152 without modification of the housing 152. For example, the nonvolatile memory may be embedded in a self-adhesive label 154. In one preferred embodiment, the nonvolatile memory 156 may be a Flash memory device, ROM device, etc., embedded into or coupled to the inside or outside of the tape cartridge 150. The nonvolatile memory is accessible by the tape drive and the tape operating software (the driver software), and/or other device.

Static random access memory (SRAM) storing data and/or instructions is typically protected against soft errors by shortened extended Hamming error correction codes (ECCs) that are configured to correct a single bit error discovered in a codeword in which original data is encoded. However, there is a need to provide more information about the errors occurring in a codeword when decoding fails to produce a corrected codeword without errors therein. Therefore, in several embodiments described herein, a family of linear block codes configured to correct single bit errors and detecting multiple odd or even numbers of bit errors are described, which include shortened extended Hamming codes having unique characteristics. Also, the design of decoding algorithms configured to detect multiple odd and even numbers of bit errors in a codeword stored in RAM are also described in several embodiments. The probability of soft errors increases as a size of the RAM increases and therefore soft errors are of particular importance for applications that use large amounts of memory, such as big data analytics. Furthermore, millions of chips that include RAMs may be produced during the lifecycle of a product, thus significantly increasing the likelihood of encountering soft errors during the lifecycle of a product. The capability that this family of linear block codes provides to detect even and odd numbers of bit errors (such as double-bit errors and triple-bit errors) may be used to indicate bad modules in a memory subsystem. The decoding algorithms may be used in data storage applications, such as protecting encoded data stored in SRAM, data stored in dynamic random access memory (DRAM), data stored in other memory types, data transferred in data transmissions, along with other unspecified data storage applications.

Figure 3:
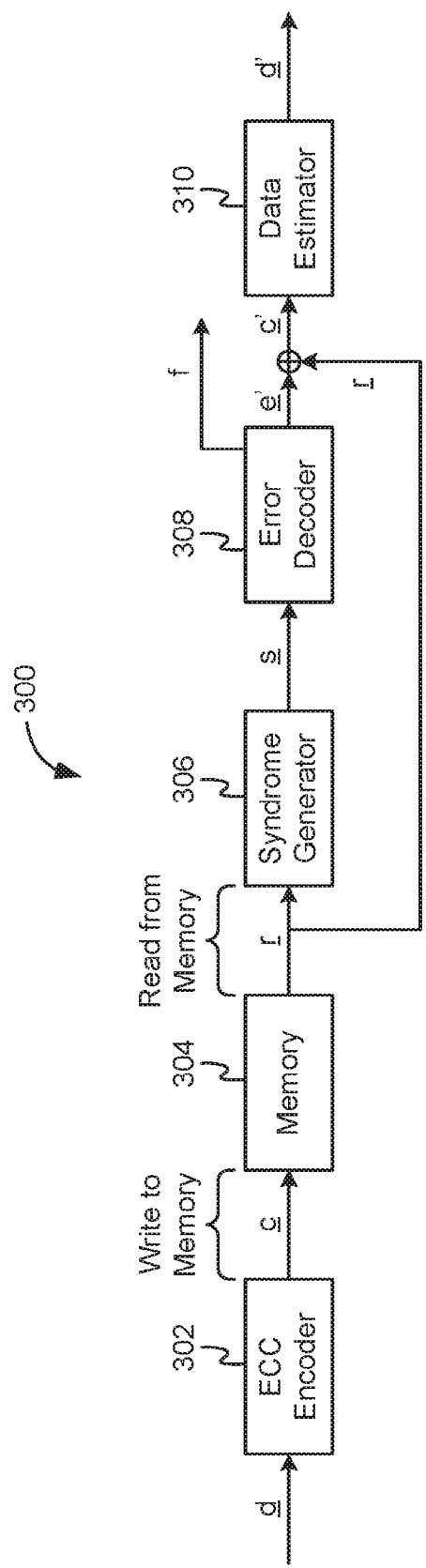
FIG. 3 shows a system configured to encode and decode data according to one embodiment.

Now referring to FIG. 3, a system 300 configured to encode and decode data is shown according to one embodiment. Any of the components of the system 300 may be implemented in hardware, software, or a combination of hardware and software. For example, one or more of the components of the system 300 may comprise a hardware module having hardware logic implemented therewith, such as an application specific integrated circuit (ASIC), a field programmable gate array (FPGA), combinations thereof, etc. In another approach, one or more of the components of the system 300 may comprise a central processing unit (CPU), a microprocessor, etc., having access to software logic configured to cause the CPU to perform one or more functions specified by the logic. In another embodiment, some aspects of one or more of the components of the system 300 may comprise a hardware processing circuit configured to perform some function(s), and a hardware processor and software logic configured to perform other function(s).

In FIG. 3, one or more data words d are received by an ECC encoder 302. The ECC encoder 302 comprises logic configured to encode the one or more data words d to produce one or more codewords c. The logic may be implemented in hardware, software, or a combination thereof. Each data word may be represented as a data column vector d which includes k elements or components (individual binary values stored therein, limited to being 0 or 1). The ECC encoder 302 is configured to encode the one or more data words d with a linear block code to produce a corresponding number of codewords c. Each data word d has a dimension of k×1, and each codeword c has a dimension of n×1.

Linear block codes are a subclass of ECCs. Almost all ECCs that are used for data encoding are linear. The strong structural property of code linearity is helpful in guiding the search for good ECCs. Moreover, encoders and decoders for linear codes are very practical from an implementation viewpoint. The set of all n-tuples with elements from the finite field (Galois field) with q elements (q is a power of a prime number) denoted by GF(q) is a n-dimensional vector space $GF(q)^n$ where the addition of two vectors is defined as component-wise addition and multiplication of a vector by a scalar from GF(q) is defined by component-wise scalar multiplication. A linear block code C includes or consists of a set of specified n-tuples (codewords) with elements from GF(q) such that the following linearity property holds: When x and y are two n-tuples (codewords) in C and a and b are two elements from GF(q), then a x+b y is a codeword in C. In other words, every linear block code C is a k-dimensional subspace of the n-dimensional vector space $GF(q)^n$ where n is the length of the code. Note that the all-zero codeword, the origin of the subspace C, is always a codeword in a linear block code C. A linear block code C is referred to as a (n,k) code where k is the dimension of the code and n is the length of the code.

The encoder of a linear ECC maps k-tuples from the vector space $GF(q)^k$ into codewords in C in a one-to-one manner. The rate of the linear ECC k/n is defined as the ratio of the dimension and the length of the code. The encoder of a linear ECC is systematic when the codewords produced at the output of the encoder may be represented as the concatenation (linking together) of a k-tuple of uncoded data symbols and an (n−k)-tuple of parity symbols. The same linear ECC may be used with a systematic encoder or with a nonsystematic encoder which does embed the input data vector into the codeword. Therefore, the use of a systematic encoder is not a requirement, as a nonsystematic encoder may be used in some embodiments. A systematic encoder may be used because if the decoding process fails, the decoder is still able to output the data part of the codeword and raise a flag indicating decoding failure, and because a systematic encoder minimizes encoding latency. The encoder is configured to output the data symbols as they arrive at the encoder output because they are part of the codeword and start computing the parity check symbols as the data is received. A systematic encoder appends the parity symbols at the end of the data word thus minimizing encoding latency.

The systematic encoder for a linear block code C may be characterized by a k×n generator matrix G in one embodiment, where G=[$I_k$ P], with $I_k$ being the k×k identity matrix and P being a k×(n−k) matrix. The encoding process to generate the codeword c (assumed to be a column vector, but may be a row vector in some approaches), which has n components, may be produced by multiplying the transpose of the generator matrix $G^T$ with an input data column vector d which has k components: c=$G^T$ d, where G is a generator matrix of size k×n, and $G^T$ is the transpose of the generator matrix G.

The system 300 also includes a memory 304 to which the codeword(s) is written and then stored at least temporarily. The memory 304 may be RAM, SRAM, dynamic random access memory (DRAM), or some other memory suitable for storing binary-encoded data. Moreover, the codeword(s) may be stored across a plurality of memories of the same or different type, arranged in a RAID configuration, according to one embodiment.

The system 300 also includes a syndrome generator 306. The syndrome generator 306 comprises logic configured to compute a syndrome word s based on a product of the codeword read from the memory 304 (read codeword r), and a parity check matrix H derived from the linear block code C. The syndrome word s has a dimension of (n−k)×1. The logic may be implemented in hardware, software, or a combination thereof.

The dual code $C^d$ may be described by a (n−k)×n generator matrix G whose rows span the (n−k)-dimensional subspace $C^d$. The generator matrix G of $C^d$ can also be referred to as a parity check matrix H of C because all the rows of H are orthogonal to all code words c in C such that 0=H c=H $G^T$ d, where 0 is an all-zero column vector. In other words, a parity-check matrix H provides another way of characterizing a code C as the null space of H. Furthermore, the product of a parity-check matrix and the transpose of the generator matrix is the all-zero matrix, e.g., H $G^T$=0.

In addition, the generator matrix G and the parity check matrix H defining the ECC encoder 302 and the error decoder 308, respectively, are not determined by a specified code corresponding to a set of codewords. If it is assumed that G=[$I_k$ P], an appropriate expression for a parity check matrix is given by H=[$-P^T$ $I_{n-k}$], where $I_{n-k}$ is the (n−k)×(n−k) identity matrix and $P^T$ is the transpose of P. Binary Hamming codes over the field GF(2) are a family of codes with parameter m where n=$2^m$−1, and k=$2^m$−1−m.

Addition in GF(2) may be accomplished with a XOR gate (exclusive or operation, such as modulo 2 addition) whereas multiplication in GF(2) may be performed with an AND gate, according to several embodiments. Binary Hamming codes may correct a single bit error in a codeword. Extended binary Hamming codes over the field GF(2) are a family of codes with parameter m where n=$2^m$, and k=$2^m$−1−m. Therefore, the number of parity bits are n−k=m+1, and the parity-check matrix H has m+1 linearly independent rows.

The weight of a codeword is the total number of nonzero symbols in the codeword, i.e., the total number of 1's in the case of binary codes. Extended Hamming codes are even-weight codes because the weight of all extended Hamming codewords is always an even number.

In contrast, shortened extended Hamming codes over the field GF(2) are often used to protect data that is stored either in SRAM or DRAM. In one embodiment, the extended Hamming codes may be shortened by u bits to obtain a family of shortened extended Hamming codes with parameters m and u where n=$2^m$−u, and k=$2^m$−1−m−u.

For example, for m=4 and u=3, the shortened extended Hamming code (13,8) is obtained where n=13 and k=8, whereas for m=6 and u=25 the shortened extended Hamming code (39,32) is obtained where n=39 and k=32. Furthermore, for m=7 and u=56, the shortened extended Hamming code (72,64) is obtained where n=72 and k=64 and the code rate is 64/72=8/9. A shortened extended Hamming code is an even-weight subcode of a Hamming code.

In practice, the length of the data to be protected in SRAM or DRAM memory is often a power of two such as k=32 or k=64. In this case, k=$2^v$, and a family of shortened extended Hamming codes may be described by a single parameter v where n=$2^v$+v+2, and k=$2^v$.

In one embodiment, the parity check matrix H is a matrix of size (n−k)×n. In accordance with one embodiment, the read codeword r is equal to the stored codeword c plus some error word e characterizing errors that occur during encoding of the data d, writing of the codeword c to the memory 304, and/or reading of the codeword c from the memory 304, e.g., r=c+e. Principally, the error word e characterizes the errors that occur during reading of the codeword c from the memory 304. Therefore, s=H r=H (c+e)=H e. The read codeword r has a dimension of n×1, and the error word e has a dimension of n×1.

The system 300 also includes an error decoder 308. The error decoder 308 comprises logic configured to decode the read codeword r to determine an estimated number of bit errors in the read codeword r, and to set a flag f corresponding to the estimated number of bit errors in the read codeword r. The flag f may be a 1×1 flag, such as a bit flag, or may be a flag configured to store at least as many values as there are determinations made by the decoder logic, such as 4 values or 8 values, e.g., a 2-bit or 3-bit flag. The logic of the error decoder 308 may be implemented in hardware, software, or a combination thereof.

The input of the error decoder 308 is the syndrome word s. The syndrome generator 306 for a linear block code computes the syndrome word s associated with a read code word r where s=H r=H (c+e)=H e. The read codeword r which is the sum of the codeword c and the error word e characterizing the errors occurring at least during the read process, e.g., r=c+e.

The syndrome word s may provide valuable information on the type of errors that occur in the channel which may then be used for error correction and/or error detection, as described herein in several embodiments.

The notation x(i) indicates the i-th component of a column vector x, and the notation x(1:i) indicates a lower dimensionality column vector that contains the first i components of a column vector x. In one embodiment, the ECC encoder 302 may be systematic, in other words, the first k components of the codeword c is the data word d such that d=c(1:k).

The error decoder 308 is either successful in decoding and generates an estimated codeword c' and an estimated data word d' and outputs an error detection flag f indicating no errors, or the error decoder 308 raises the error detection flag f signaling that it cannot produce a good estimate of the codeword, referred to as a decoder failure. In case of a decoding failure, the decoder may still output c'=r (no errors have been corrected although errors have been detected by the error decoder 308) and the estimated data word d' corresponding to c'=r. One of the benefits of using systematic encoders is that all the uncorrected errors may be in the parity part and when the parity part is dropped from c' to generate d' it may occur that d' is estimated correctly in the presence of errors although the error decoder 308 did not correct the errors. Note that even when the error decoder 308 is successful in producing the estimates c' and d', the error decoder 308 may still produce an error, referred to as a decoder error, in which case the decoding result is not correct, i.e., c' c and d' d.

In one embodiment, the logic of the error decoder 308 is configured to set the flag f to a first value indicating that the read codeword c includes no errors in response to a first determination requiring that the syndrome word s is an all-zero vector, e.g., s=0.

The logic of the error decoder 308 is also configured to set the flag f to a second value indicating that the read codeword r includes exactly one single-bit error in response to a second determination requiring that the syndrome word s equals a column of the parity check matrix H, e.g., $s=h_k$ for some k where $1 \leq k \leq n$.

The logic of the error decoder 308 is also configured to set the flag f to a third value indicating that the read codeword c includes an odd number of multiple bit errors in response to a third determination. The several embodiments of the third determination are described in more detail later.

The logic of the error decoder 308 is also configured to set the flag f to a fourth value indicating that the read codeword c includes an even number of multiple bit errors in response to a fourth determination. The several embodiments of the fourth determination are described in more detail later.

The logic of the error decoder 308 is also configured to output the flag f corresponding to the estimated number of bit errors in the read codeword r.

The logic of the error decoder 308 may also be configured to output the read codeword r in response to one or more uncorrectable errors being detected in the read codeword r in one embodiment. This read codeword r may be used in subsequent processing.

In another embodiment, the error decoder 308 may output only r(1:k) (the first k components of r) corresponding to the estimated data word d' if a systematic encoder is used. An alternative would be that error decoder 308 does not output r, but sets c'=r and e'=0 when errors have been detected that cannot be corrected. Data estimator 310 is configured to generate the data estimate, e.g., by dropping the parity bits in case of systematic encoding. In other words, the final outputs in FIG. 3 are always the flag f and the estimated data word d' and from the flag f, it is determinable whether a good estimated data word is output, i.e., whether the decoder was in error correction mode or decoding failure mode.

The logic of the error decoder 308 is further configured to calculate an estimated error word e' having a dimension of n×1. The estimated error word e' may be added to the read codeword r to produce an estimated codeword c' having a dimension of n×1, e.g., c'=r+e' according to one embodiment. This estimated codeword c' is output to the data estimator 310.

The data estimator 310, in one embodiment, comprises logic configured to produce an estimated data word d' that has a dimension of k×1 based on the estimated codeword c' as an input. The logic of the data estimator 310 may be implemented in hardware, software, or a combination thereof.

The parity check matrix H associated with a linear block code, which has (n−k) linearly independent rows, may be represented by its columns, $H=[h_1\ h_2\ h_3\ \ldots\ h_n]$, where $h_i$ is the i-th column of H, $1 \leq i \leq n$.

According to a first embodiment, a class of linear block codes that have a first type of parity check matrix structure $H_1$ with desirable error correction and error detection properties is introduced. Specifically, the parity check matrix $H_1$ of a linear block code satisfies the following four conditions:
 1) $h_i \neq 0$, for $1 \leq i \leq n$;
 2) $h_i \neq h_j$, for $1 \leq i < j \leq n$;
 3) $h_i + h_j \neq h_s$, for $1 \leq i < j \leq n$, and $1 \leq s \leq n$; and
 4) an all-one row is obtained by adding a select group of rows in $H_1$.

The first condition states that all columns of the parity check matrix $H_1$ have at least one nonzero component. The second condition states that all the columns of the parity check matrix $H_1$ are different from each other. The third condition states that the sum of two different columns in the parity check matrix $H_1$ does not result in another column of the parity check matrix $H_1$. Finally, the fourth condition states that all codewords characterized by the parity check matrix $H_1$ have an even weight, i.e., an even number of ones. In other words, all codewords c characterized by the parity check matrix $H_1$ have even parity, e.g., $c(1)+c(2)+\ldots+c(n)=0$.

The first three conditions state that any three columns of the parity check matrix $H_1$ are linearly independent. In general, a code has a minimum Hamming distance $d_{min}$ if and only if any $d_{min}-1$ columns of a parity check matrix $H_1$ are linearly independent and some $d_{min}$ columns are linearly dependent. Therefore, the first three conditions describes how the minimum Hamming distance of the code is at least four, and the last condition ensures that all codewords have an even number of ones, i.e., even parity.

In the first embodiment, the syndrome generator 306 is configured to receive a codeword r from memory 304 and generate the syndrome s by multiplying the parity check matrix $H_1$ defined above with the read codeword r.

In another embodiment, the error decoder 308 uses two sets of columns, E and O, where E={x|x=sum of e columns in $H_1$, where e≥2 and e is an even number, and x≠0}, O={x|x=sum of o columns in $H_1$, where o≥3 and o is an odd number, and x≠$h_i$, 1≤i≤n} to generate the flag f and estimated error word e'. The sets E and O are precomputed offline from the parity check matrix $H_1$ using a computer, manually when the code is small, or by some other suitable process. The sets E and O are fixed, i.e., they do not change or depend on the read codeword r or the syndrome s.

The syndrome of an error word e with an odd number of erroneous bits cannot be equal to the syndrome of an error word e with an even number of erroneous bits because this would require that the sum of some odd number of columns in $H_1$ is equal to the sum of some even number of columns in $H_1$, e.g., $h_i + h_j + h_s = h_u + h_v$, which is equivalent to the sum of some odd number of columns being equal to the all-zero column vector 0, e.g., $h_i + h_j + h_s + h_u + h_v = 0$. The latter condition indicates the existence of an odd-parity codeword in the code which is a contradiction to the condition that all codewords have even weight or even parity. Therefore, the intersection of E and O is the empty set, E∩O=Ø.

It can be shown that $|E|=2^{n-k-1}$ and $|O|=2^{n-k-1}-n$ where |X| denotes the number of elements in the set X. Briefly, any (n−k)×n parity check matrix $H_1$=[A B], where A is (n−k)×(n−k) matrix and B is (n−k)×k matrix, is transformable after a fixed permutation of the code symbols within a codeword into the form $H_1'$=[C D], where C is a (n−k)×(n−k) matrix that has full rank and D is a (n−k)×k matrix. Note that the codes described by $H_1$ and $H_1'$ are then equivalent codes by definition. In a second step, a parity check matrix $H_1''$=[$I_{n-k}$ $C^{-1}D$] is obtained, where $H_1''=C^{-1} H_1'$. Using Pascal's triangle, the number of error words e with an even number of ones is equal to the number of error words e with an odd number of ones. The statement $|E|=2^{n-k-1}-1$ and $|O|=2^{n-k-1}-n$ is valid for s''=$H_1''$e because all the syndromes with an even number of ones and all the syndromes with an odd number of ones may be generated using the first (n−k) columns of $H_1''$ that contain (n−k) unit vectors. The statement $|E|=2^{n-k-1}-1$ and $|O|=2^{n-k-1}-n$ is also valid for s'=$H_1'$e=CH$_1''$e=Cs'' because the nonsingular matrix C performs a one-to-one mapping from s'' to s'. The statement $|E|=2^{n-k-1}-1$ and $|O|=2^{n-k-1}-n$ still remains valid for s=$H_1$e because $H_1$ may be obtained from $H_1'$ by permuting the columns of $H_1'$.

In another further embodiment, the error decoder 308 uses two additional sets of columns, D and T that are subsets of E and O to generate the flag f and estimated error word e'. D={x|x=sum of two columns in $H_1$}⊆E, and T={x|x=sum of three columns in $H_1$, and x≠$h_i$, 1≤i≤n}⊆O. The sets D and T are precomputed offline from the parity check matrix $H_1$ using a computer, manually when the code is small, or by other process. The sets D and T are fixed, i.e., they do not change or depend on the read codeword r or the syndrome s. It has been observed that only in rare cases D is a proper subset of E and T is a proper subset of O. For most codes of practical interest D=E and T=0.

In the first embodiment, the error decoder 308 is configured to distinguish between four cases.

Case 1: s=0.

The error decoder 308 assumes e'=0 and outputs c'=r and d'=c'(1:k). In this case, it is not necessary that the data read was error-free, i.e., e=0. Although very rare, a decoder error may occur resulting in s=0. Assuming the written codeword was c=$c_1$ and the error in the channel corresponds to another permitted codeword e=$c_2$. Therefore, in this example, the data read r=c+e=$c_1$+$c_2$=$c_3$ is a codeword $c_3$ other than the codeword $c_1$ originally written to the memory due to the linearity of the code, thus causing a decoder error.

Case 2: s=$h_k$ for some k where 1≤k≤n.

The error decoder 308 outputs c'=r+e', d'=c'(1:k) where the estimated error word e' is defined by e'(i)=1 when i=k and e'(i)=0 when i≠k.

Case 3: s∈E.

The error decoder 308 fails to decode and raises the flag f indicating the detection of an even number of multiple bit errors, where the most likely scenario for binary symmetric channels is two uncorrectable erroneous bits in r in response to a determination that the syndrome s may be expressed as the sum of two columns in the parity check matrix $H_1$, i.e., s∈D.

Case 4: s∈O

The error decoder 308 fails to decode and raises the flag f indicating the detection of an odd number of multiple errors, where the most likely scenario for binary symmetric channels is three uncorrectable erroneous bits in r in response to a determination that the syndrome s may be expressed as the sum of three columns in the parity check matrix $H_1$, i.e., s∈T.

Figure 4:
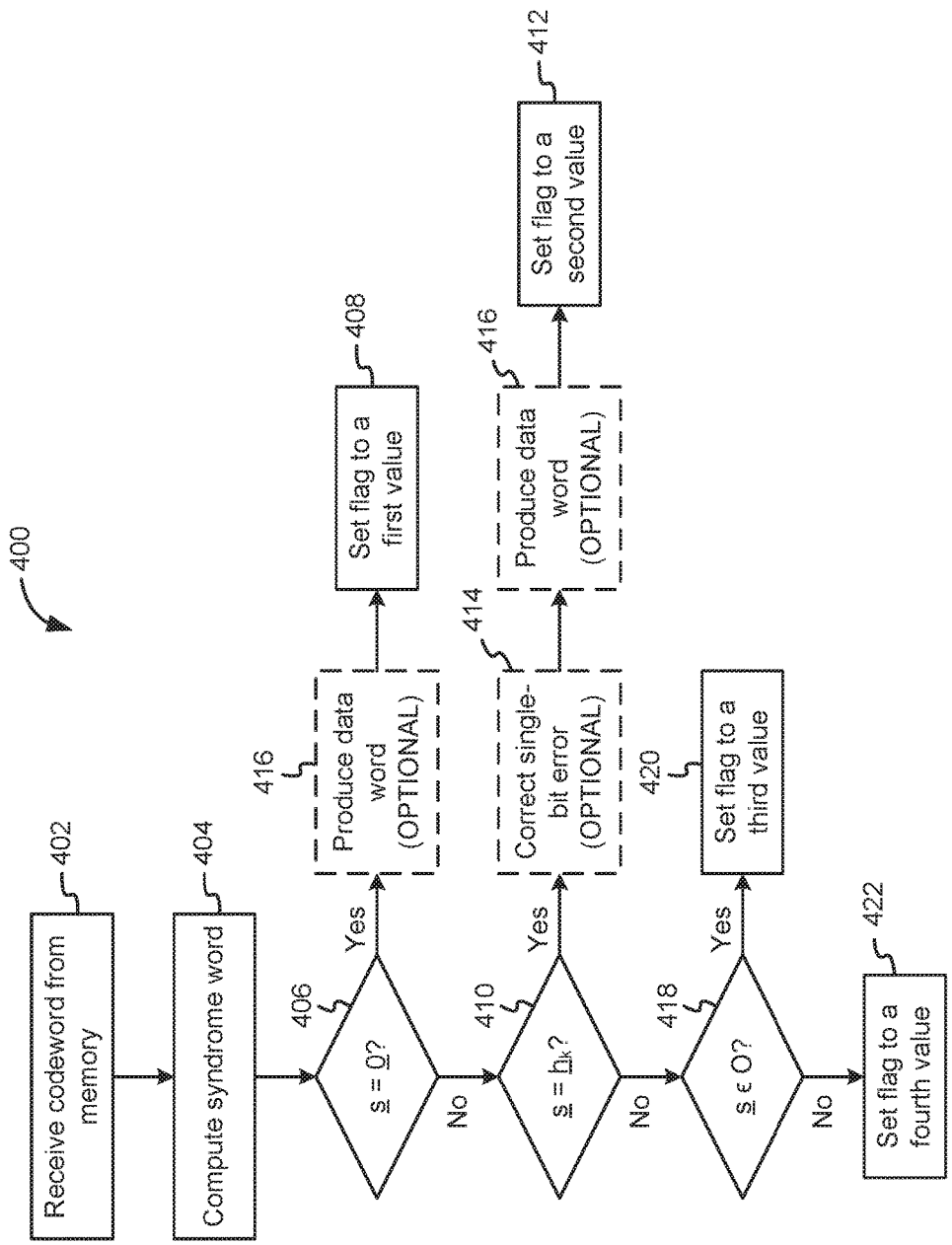
FIG. 4 shows a flowchart of a method for decoding a codeword, according to a first embodiment.

Now referring to FIG. 4, a flowchart is shown of a method 400 for decoding a codeword according to the first embodiment. In operation 402, the read codeword r is received from the memory.

In operation 404, the syndrome word s is computed based on a product of the codeword and a parity check matrix derived from the linear block code, e.g., s=$H_1$r.

In operation 406, in a first determination, it is determined whether the syndrome word s is an all-zero vector, e.g., s=0. In operation 408, in response to the first determination (that the syndrome word is an all-zero vector), the flag f is set to a first value indicating that the estimated codeword c' includes no errors. The first value may be 0, 1, 2, or any other value predetermined to indicate that the estimated codeword c' includes no errors.

In operation 410, in a second determination, it is determined whether the syndrome word s equals a column of the parity check matrix $H_1$, e.g., s=$h_k$ for some k where 1≤k≤n. In operation 412, in response to the second determination (that the syndrome word s equals a column of the parity check matrix $H_1$), the flag f is set to a second value indicating that the estimated codeword c' includes exactly one single-bit error. The second value may be 1, 2, 3 or any other value predetermined to indicate that the estimated codeword c' includes exactly one single-bit error.

In optional operation 414, in a further embodiment, the single-bit error may be corrected by adding an estimated error word e' to the estimated codeword c' in response to the second determination, e.g., c'=r+e' where s=$h_k$ for some k where 1≤k≤n, e'(i)=1 when i=k, and e'(i)=0 when i≠k. This operation occurs prior to outputting the estimated data word d'.

In optional operation 416, in a further embodiment, an estimated data word d' is produced based on the estimated codeword c' and the estimated number of bit errors in the codeword c' in response to the first determination or the second determination, e.g., d'=c'(1:k). This estimated data word d' is output with the flag f.

In operation 418, in a third determination, it is determined whether the syndrome word s is equal to a sum of columns that are greater than or equal to three in quantity and odd from the parity check matrix $H_1$, e.g., s∈O. In operation 420, in response to the third determination (that the syndrome word s is equal to the sum of columns that are greater than or equal to three in quantity and odd from the parity check matrix $H_1$), the flag f is set to a third value indicating that the estimated codeword c' includes an odd number of bit errors greater than one, such as three, five, etc. The third value may be 2, 3, 4 or any other value predetermined to indicate that the estimated codeword c' includes an odd number of bit errors greater than one.

In operation 422, a fourth determination is made requiring the absence of the first, second, or third determinations, and in response to the fourth determination, the flag f is set to a fourth value indicating that the estimated codeword c' includes an even number of bit errors, such as two, four, six, etc. The fourth value may be 2, 3, 4, 5 or any other value predetermined to indicate that the estimated codeword c' includes an even number of bit errors.

Figure 5:
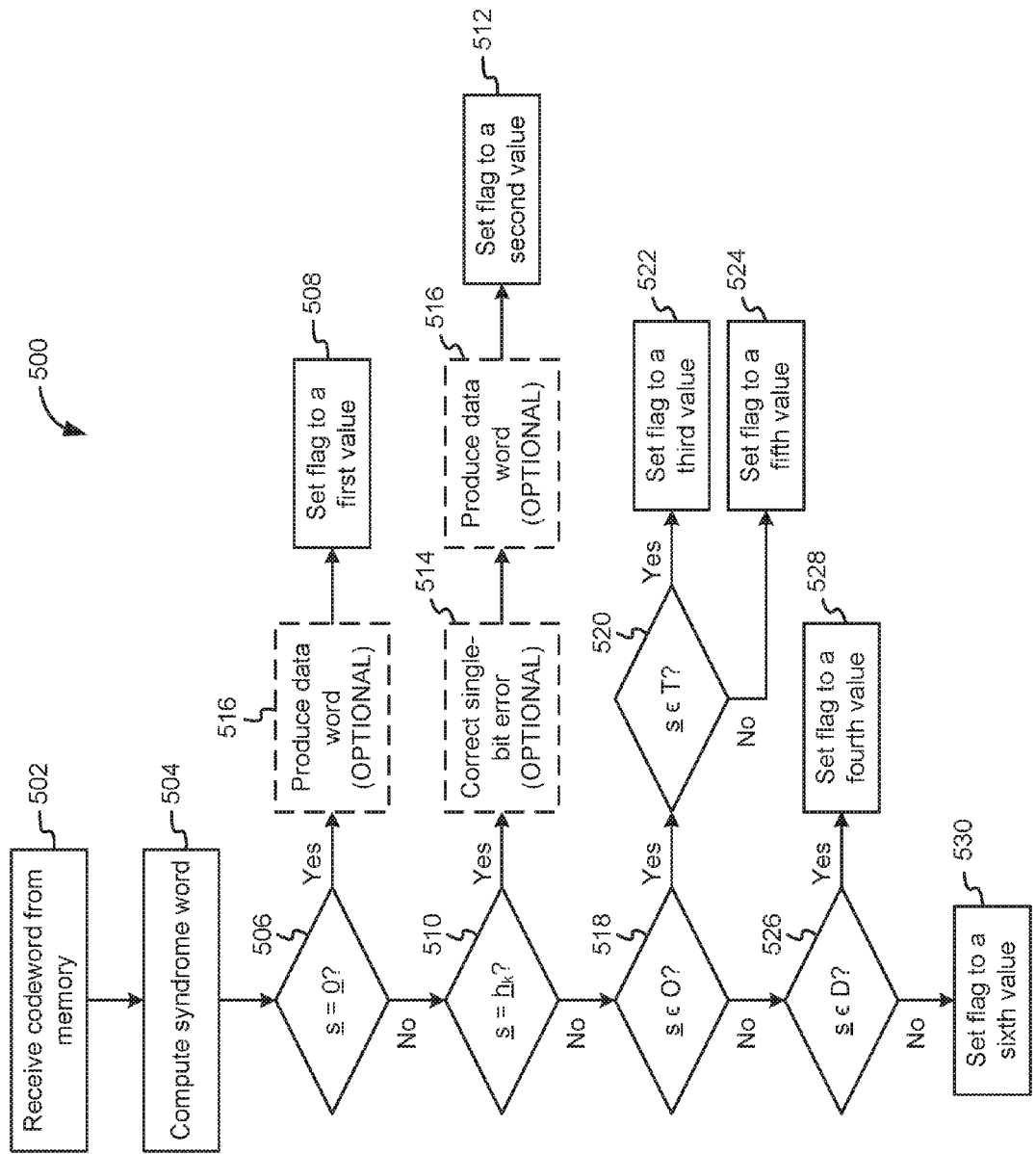
FIG. 5 shows another flowchart of a method for decoding a codeword, according to the first embodiment.

Now referring to FIG. 5, a flowchart is shown of another method 500 for decoding a codeword according to the first embodiment. In operation 502, the read codeword r is received from the memory.

In operation 504, the syndrome word s is computed based on a product of the codeword and a parity check matrix derived from the linear block code, e.g., $s=H_1 r$.

In operation 506, in a first determination, it is determined whether the syndrome word s is an all-zero vector, e.g., s=0. In operation 508, in response to the first determination (that the syndrome word is an all-zero vector), the flag f is set to a first value indicating that the estimated codeword c' includes no errors. The first value may be 0, 1, 2, or any other value predetermined to indicate that the estimated codeword c' includes no errors.

In operation 510, in a second determination, it is determined whether the syndrome word s equals a column of the parity check matrix $H_1$, e.g., $s=h_k$ for some k where $1 \leq k \leq n$. In operation 512, in response to the second determination (that the syndrome word s equals a column of the parity check matrix $H_1$), the flag f is set to a second value indicating that the estimated codeword c' includes exactly one single-bit error. The second value may be 1, 2, 3 or any other value predetermined to indicate that the estimated codeword c' includes exactly one single-bit error.

In optional operation 514, in a further embodiment, the single-bit error may be corrected by adding an estimated error word e' to the estimated codeword c' in response to the second determination, e.g., c'=r+e' where $s=h_k$ for some k where $1 \leq k \leq n$, e'(i)=1 when i=k, and e'(i)=0 when $i \neq k$. This operation occurs prior to outputting the estimated data word d'.

In optional operation 516, in a further embodiment, an estimated data word d' is produced based on the estimated codeword c' and the estimated number of bit errors in the codeword c' in response to the first determination or the second determination, e.g., d'=c'(1:k). This estimated data word d' is output with the flag f.

In operation 518, in a third determination, it is determined whether the syndrome word s is equal to a sum of columns that are greater than or equal to three in quantity and odd from the parity check matrix $H_1$, e.g., $s \in O$.

Then, in operation 520, in a fifth determination, it is determined whether the syndrome word s is equal to a sum of three columns from the parity check matrix $H_1$, e.g., $s \in T$.

In operation 522, in response to the third and fifth determinations (that the syndrome word s belongs in the sets O and T), the flag f is set to a third value indicating that the estimated codeword c' includes exactly three bit errors.

In operation 524, when the syndrome word s is not equal to a sum of three columns from the parity check matrix $H_1$, e.g., $s \notin T$, the flag f is set to a fifth value indicating that the estimated codeword c' includes an odd number of bit errors numbering five or greater.

In operation 526, in a fourth determination, it is determined whether the syndrome word s is equal to a sum of two columns in the parity check matrix $H_1$, e.g., $s \in D$.

In operation 528, in response to the fourth determination (that the syndrome word s belongs in the set D), the flag f is set to a fourth value indicating that the estimated codeword c' includes exactly two bit errors. The fourth value may be 2, 3, 4 or any other value predetermined to indicate that the estimated codeword c' includes exactly two bit errors.

In operation 530, when the syndrome word s does not equal to a sum of two columns in the parity check matrix $H_1$, e.g., $s \notin D$, which is also indicative of the absence of the first, second, third, fourth, or fifth determination, the flag f is set to a sixth value indicating that the estimated codeword c' includes an even number of bit errors greater than or equal to four. The sixth value may be 3, 4, 5, 6 or any other value predetermined to indicate that the estimated codeword c' includes an even number of bit errors greater than or equal to four.

Figure 6:
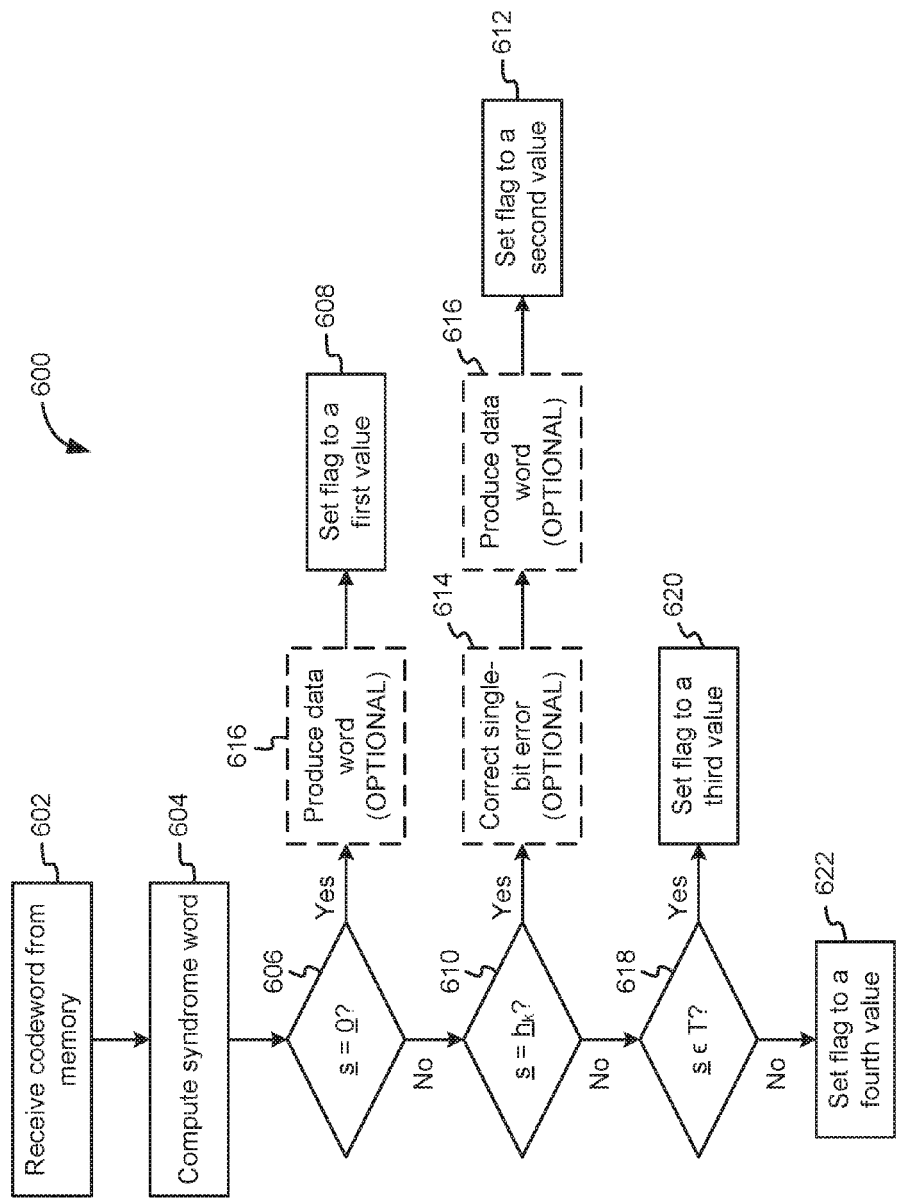
FIG. 6 shows another flowchart of a method for decoding a codeword, according to the first embodiment.

Now referring to FIG. 6, a flowchart is shown of another method 600 for decoding a codeword according to the first embodiment. In operation 602, the read codeword r is received from the memory.

In operation 604, the syndrome word s is computed based on a product of the codeword and a parity check matrix derived from the linear block code, e.g., $s=H_1 r$.

In operation 606, in a first determination, it is determined whether the syndrome word s is an all-zero vector, e.g., s=0. In operation 608, in response to the first determination (that the syndrome word is an all-zero vector), the flag f is set to a first value indicating that the estimated codeword c' includes no errors. The first value may be 0, 1, 2, or any other value predetermined to indicate that the estimated codeword c' includes no errors.

In operation 610, in a second determination, it is determined whether the syndrome word s equals a column of the parity check matrix $H_1$, e.g., $s=h_k$ for some k where $1 \leq k \leq n$. In operation 612, in response to the second determination (that the syndrome word s equals a column of the parity check matrix $H_1$), the flag f is set to a second value indicating that the estimated codeword c' includes exactly one single-bit error. The second value may be 1, 2, 3 or any other value predetermined to indicate that the estimated codeword c' includes exactly one single-bit error.

In optional operation 614, in a further embodiment, the single-bit error may be corrected by adding an estimated error word e' to the estimated codeword c' in response to the second determination, e.g., c'=r+e' where $s=h_k$ for some k where $1 \leq k \leq n$, e'(i)=1 when i=k, and e'(i)=0 when $i \neq k$. This operation occurs prior to outputting the estimated data word d'.

In optional operation 616, in a further embodiment, an estimated data word d' is produced based on the estimated codeword c' and the estimated number of bit errors in the codeword c' in response to the first determination or the second determination, e.g., d'=c'(1:k). This estimated data word d' is output with the flag f.

In operation 618, in a third determination, it is determined whether the syndrome word s is equal to a sum of three columns in the parity check matrix, e.g., $s \in T$.

In operation 620, in response to the third determination (that the syndrome word s belongs to the set T), the flag f is set to a third value indicating that the estimated codeword c' includes three bit errors. The third value may be 2, 3, 4 or any other value predetermined to indicate that the estimated codeword c' includes three bit errors.

In operation 622, in response to a fourth determination indicating the absence of the first, second, or third determinations, the flag f is set to a fourth value indicating that the estimated codeword c' includes two bit errors. The fourth value may be 2, 3, 4, 5 or any other value predetermined to indicate that the estimated codeword c' includes two bit errors.

Another type of parity check matrix $H_2$ that is a special type of $H_1$ parity check matrix is now described according to a second embodiment. The second parity check matrix $H_2$ corresponds to a shortened extended Hamming code which satisfies the following two conditions:
1) $h_i(n-k)=1$, for $1 \leq i \leq n$; and
2) $h_i(1:n-k-1) \neq h_j(1:n-k-1)$, for $1 \leq i < j \leq n$.

The first condition states that the last row of the parity check matrix $H_2$ includes only ones indicating that the code is a subcode of an even parity code, i.e., all codewords have even weight. Note that the all-one row of $H_2$ does not have to be the last row as indicated by the first condition, but may be any row in $H_2$. The second condition states that the columns of $H_2'$ are all different (unique), where $H_2'$ is the $(n-k-1) \times n$ matrix obtained from $H_2$ after removing the all-one row.

The second parity check matrix $H_2$ is a special case of the first parity check matrix $H_1$ for the following reasons. The first condition ensures that $h_i \neq 0$, for $1 \leq i \leq n$. The second condition ensures that $h_i \neq h_j$, for $1 \leq i < j \leq n$. The two conditions together ensure that $h_i + h_j \neq h_s$, for $1 \leq i < j \leq n$ and $1 \leq s \leq n$ because the $(n-k)$-th component of $h_i + h_j$ is always 0, whereas the $(n-k)$-th component of $h_s$ is always 1. Finally, the first condition ensures that the all-one vector is actually a row of the second parity check matrix $H_2$.

In the second embodiment, referring again to FIG. 3, the syndrome generator 306 is configured to receive a codeword r from memory 304 and generate the syndrome s by multiplying the second parity check matrix $H_2$ with the read codeword r.

The error decoder 308 then receives the syndrome word s from the syndrome generator 306, and distinguishes between four cases in the second embodiment.

Case 1: s=0.

The error decoder 308 assumes e'=0 and outputs c'=r and d'=c'(1:k). In this case, it is not necessary that the data read was error-free, i.e., e=0. Although very rare, a decoder error may occur resulting in s=0. Assuming that the written codeword was $c=c_1$ and the error in the channel corresponds to another permitted code word $e=c_2$. Therefore, the data read $r=c+e=c_1+c_2=c_3$ is another codeword $c_3$ than the codeword originally written to the memory due to the linearity of the code, thus causing a decoder error.

Case 2: $s=h_k$ for some k where $1 \leq k \leq n$.

The error decoder 308 outputs c'=r+e', d'=c'(1:k) where the estimated error word e' is defined by e'(i)=1 when i=k and e'(i)=0 when i≠k.

Case 3: s(n-k)=0 and s≠0.

The error decoder 308 fails to decode and raises the flag f indicating the detection of an even number of multiple bit errors, where the most likely scenario for binary symmetric channels is the presence of two uncorrectable erroneous bits in r in response to a determination that the syndrome s may be expressed as the sum of two columns in the second parity check matrix $H_2$.

Case 4: s(n-k)=1 and $s \neq h_k$ for Some k where $1 \leq k \leq n$.

The error decoder 308 fails to decode and raises the flag f indicating the detection of an odd number of multiple bit errors, where the most likely scenario for binary symmetric channels is the presence of three uncorrectable erroneous bits in r in response to a determination that the syndrome s may be expressed as the sum of three columns in the parity check matrix $H_2$.

Figure 7:
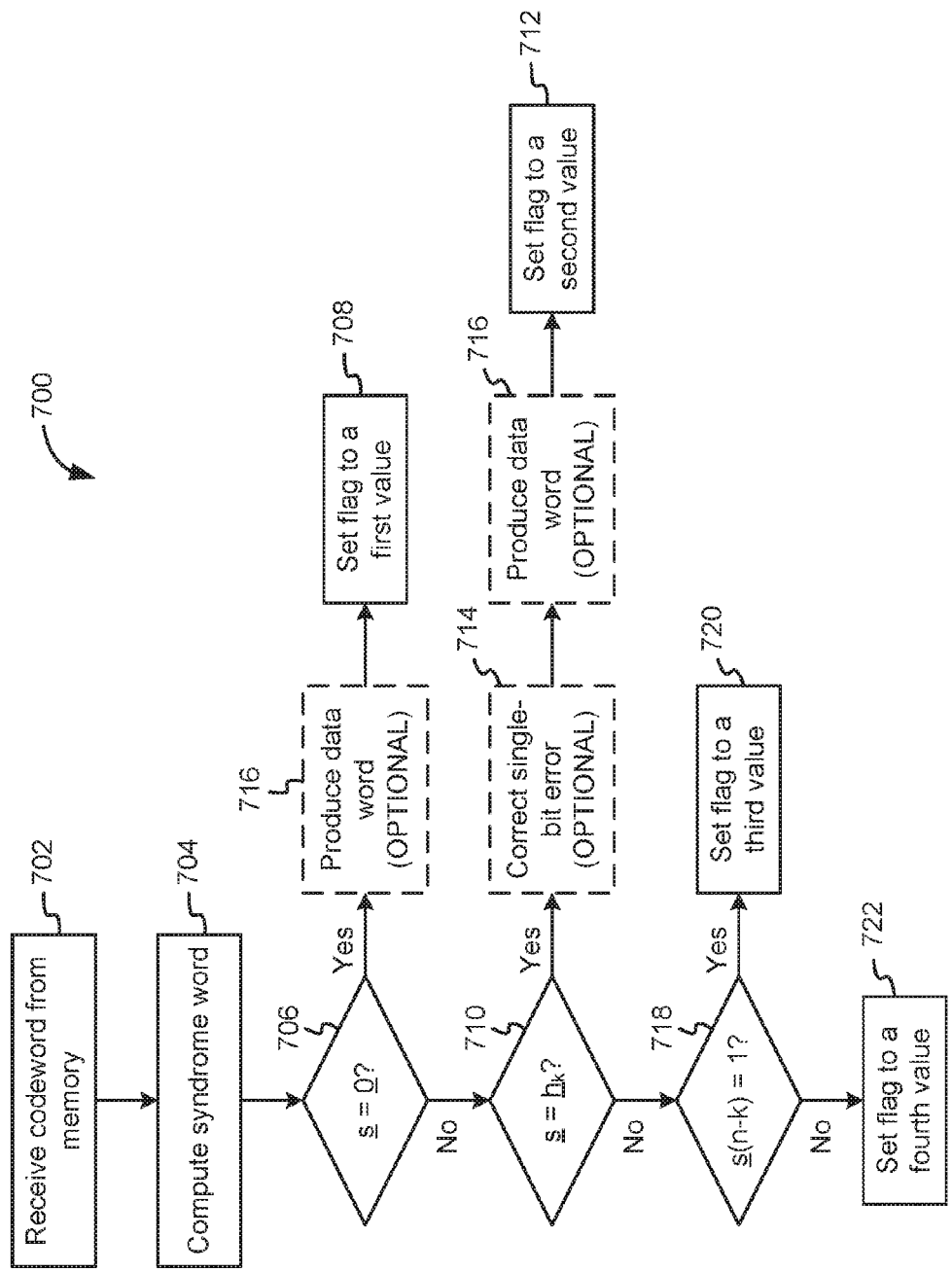
FIG. 7 shows a flowchart of a method for decoding a codeword, according to a second embodiment.

Now referring to FIG. 7, a flowchart is shown of a method 700 for decoding a codeword according to the second embodiment. In operation 702, the read codeword r is received from the memory.

In operation 704, the syndrome word s is computed based on a product of the codeword and the second parity check matrix derived from the linear block code, e.g., $s=H_2 r$.

In operation 706, in a first determination, it is determined whether the syndrome word s is an all-zero vector, e.g., s=0. In operation 708, in response to the first determination (that the syndrome word is an all-zero vector), the flag f is set to a first value indicating that the estimated codeword c' includes no errors. The first value may be 0, 1, 2, or any other value predetermined to indicate that the estimated codeword c' includes no errors.

In operation 710, in a second determination, it is determined whether the syndrome word s equals a column of the parity check matrix $H_2$, e.g., $s=h_k$ for some k where $1 \leq k \leq n$. In operation 712, in response to the second determination (that the syndrome word s equals a column of the parity check matrix $H_2$), the flag f is set to a second value indicating that the estimated codeword c' includes exactly one single-bit error. The second value may be 1, 2, 3 or any other value predetermined to indicate that the estimated codeword c' includes exactly one single-bit error.

In optional operation 714, in a further embodiment, the single-bit error may be corrected by adding an estimated error word e' to the estimated codeword c' in response to the second determination, e.g., c'=r+e' where $s=h_k$ for some k where $1 \leq k \leq n$, e'(i)=1 when i=k, and e'(i)=0 when i≠k. This operation occurs prior to outputting the estimated data word d'.

In optional operation 716, in a further embodiment, an estimated data word d' is produced based on the estimated codeword c' and the estimated number of bit errors in the codeword c' in response to the first determination or the second determination, e.g., d'=c'(1:k). This estimated data word d' is output with the flag f.

In operation 718, in a third determination, it is determined whether a last element of the syndrome word s is equal to one, e.g., s(n-k)=1. In operation 720, in response to the third determination (that the last element of the syndrome word s is equal to one), the flag f is set to a third value indicating that the estimated codeword c' includes three bit errors. The third value may be 2, 3, 4, 5 or any other value predetermined to indicate that the estimated codeword c' includes three bit errors.

In operation 722, in response to a fourth determination requiring the absence of the first, second, or third determinations, the flag f is set to a fourth value indicating that the estimated codeword c' includes two bit errors. The fourth value may be 2, 3, 4, 5 or any other value predetermined to indicate that the estimated codeword c' includes two bit errors.

Another type of parity check matrix $H_3$ that is a special type of $H_1$ parity check matrix is now described according to a third embodiment. The third parity check matrix $H_3$ corresponds to an alternative representation for a shortened extended Hamming code whose columns are distinct and have an odd number of ones. Specifically, the columns of the third parity check matrix $H_3$ satisfy the following two conditions:

1) $h_i(1)+h_i(2)+\ldots+h_i(n-k)=1$, for $1 \le i \le n$; and
2) $h_i \ne h_j$, for $1 \le i < j \le n$.

The first condition states that every column of the third parity check matrix $H_3$ has an odd number of ones, i.e., odd parity. The second condition states that all the columns of the third parity check matrix $H_3$ are different (unique) from each other.

The third parity check matrix $H_3$ is a special case of the first parity check matrix $H_1$ for the following reasons. The first condition ensures that $h_i \ne 0$, for $1 \le i \le n$. The second condition states that $h_i \ne h_j$, for $1 \le i < j \le n$. The first condition ensures that $h_i + h_j \ne h_s$, for $1 \le i < j \le n$ and $1 \le s \le n$ because $h_i + h_j$ has always even parity whereas $h_s$ has always odd parity. Note that the sum of two odd-parity vectors is always an even-parity vector. Finally, the first condition ensures that the all-one vector can be obtained as the sum of all rows of the third parity check matrix $H_3$.

In the third embodiment, referring again to FIG. 3, the syndrome generator 306 is configured to receive a codeword r from the memory 304 and generate the syndrome s by multiplying the third parity check matrix $H_3$ defined above with the read codeword r. The syndrome generator 306 then passes the syndrome word s to the error decoder 308, which is configured in the third embodiment to distinguish between the four cases described below.

Case 1: s=0

The error decoder 308 assumes e'=0 and outputs c'=r and d'=c'(1:k). In this case, it is not necessary that the data read was error-free, i.e., e=0. Although very rare, a decoder error may occur resulting in s=0. Assuming that the written codeword was $c=c_1$ and the error in the channel corresponds to another permitted codeword $e=c_2$. Therefore, the data read $r=c+e=c_1+c_2=c_3$ is another codeword $c_3$ than the codeword originally written to the memory due to the linearity of the code, thus causing a decoder error.

Case 2: $s=h_k$ for Some k where $1 \le k \le n$.

The error decoder 308 outputs c'=r+e', d'=c'(1:k) where the estimated error word e' is defined by e'(i)=1 if i=k and e'(i)=0 if i≠k.

Case 3: $s(1)+s(2)+\ldots+s(n-k)=0$ and $s \ne 0$.

The error decoder 308 fails to decode and raises the flag f indicating the detection of an even number of multiple bit errors where the most likely scenario for binary symmetric channels is the presence of two uncorrectable erroneous bits in r in response to a determination that the syndrome s may be expressed as the sum of two columns in the third parity check matrix $H_3$.

Case 4: $s(1)+s(2)+\ldots+s(n-k)=1$ and $s \ne h_k$ for Some k where $1 \le k \le n$.

The error decoder 308 fails to decode and raises the flag f indicating the detection of an odd number of multiple bit errors where the most likely scenario for binary symmetric channels is the presence of three uncorrectable erroneous bits in r in response to a determination that the syndrome s may be expressed as the sum of three columns in the parity check matrix $H_3$.

Figure 8:
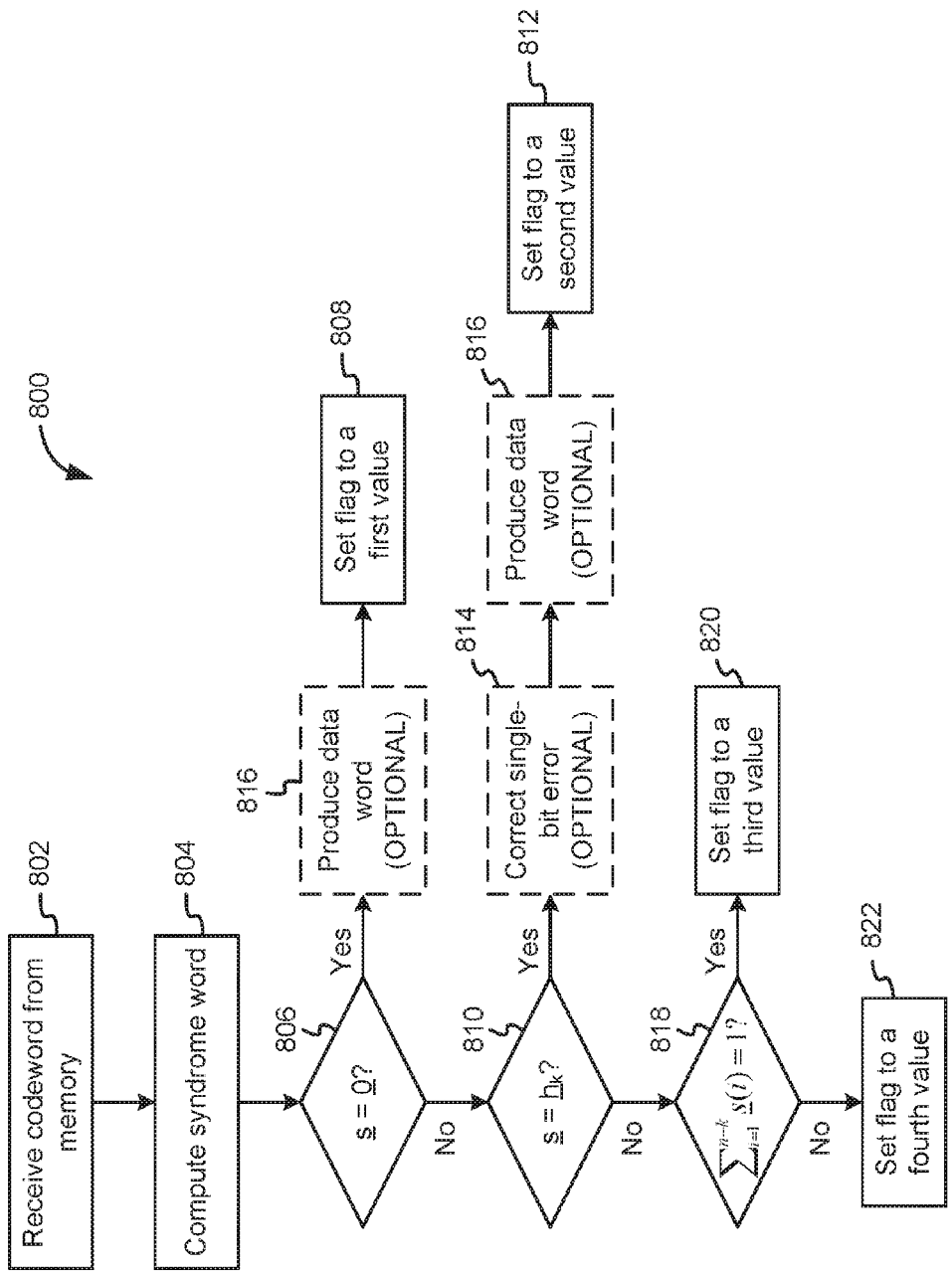
FIG. 8 shows a flowchart of a method for decoding a codeword, according to a third embodiment.

Now referring to FIG. 8, a flowchart is shown of a method 800 for decoding a codeword according to the third embodiment. In operation 802, the read codeword r is received from the memory.

In operation 804, the syndrome word s is computed based on a product of the codeword and the third parity check matrix derived from the linear block code, e.g., $s=H_3 r$.

In operation 806, in a first determination, it is determined whether the syndrome word s is an all-zero vector, e.g., s=0. In operation 808, in response to the first determination (that the syndrome word is an all-zero vector), the flag f is set to a first value indicating that the estimated codeword c' includes no errors. The first value may be 0, 1, 2, or any other value predetermined to indicate that the estimated codeword c' includes no errors.

In operation 810, in a second determination, it is determined whether the syndrome word s equals a column of the parity check matrix $H_3$, e.g., $s=h_k$ for some k where $1 \le k \le n$. In operation 812, in response to the second determination (that the syndrome word s equals a column of the parity check matrix $H_3$), the flag f is set to a second value indicating that the estimated codeword c' includes exactly one single-bit error. The second value may be 1, 2, 3 or any other value predetermined to indicate that the estimated codeword c' includes exactly one single-bit error.

In optional operation 814, in a further embodiment, the single-bit error may be corrected by adding an estimated error word e' to the estimated codeword c' in response to the second determination, e.g., c'=r+e' where $s=h_k$ for some k where $1 \le k \le n$, e'(i)=1 when i=k, and e'(i)=0 when i≠k. This operation occurs prior to outputting the estimated data word d'.

In optional operation 816, in a further embodiment, an estimated data word d' is produced based on the estimated codeword c' and the estimated number of bit errors in the codeword c' in response to the first determination or the second determination, e.g., d'=c'(1:k). This estimated data word d' is output with the flag f.

In operation 818, in a third determination, it is determined whether binary summation of all elements in the syndrome word s from i=1 to i=n−k equals one. This operation may be represented as $s(1)+s(2)+\ldots+s(n-k)=1$.

In operation 820, in response to the third determination (that binary summation of all elements in the syndrome word equals one), the flag f is set to a third value indicating that the estimated codeword c' includes three bit errors. The third value may be 2, 3, 4, 5 or any other value predetermined to indicate that the estimated codeword c' includes three bit errors.

In operation 822, in response to a fourth determination requiring the absence of the first, second, or third determinations, the flag f is set to a fourth value indicating that the estimated codeword c' includes two bit errors. The fourth value may be 2, 3, 4, 5 or any other value predetermined to indicate that the estimated codeword c' includes two bit errors.

Any of the methods described in FIGS. 4-8 may be performed in accordance with the present invention in any of the environments depicted in FIGS. 1-3, among others, in various embodiments. Of course, more or less operations than those specifically described in FIGS. 4-8 may be included in methods 400, 500, 600, 700, and 800, respectively, as would be understood by one of skill in the art upon reading the present descriptions. Moreover, the order of the operations may be changed from that shown in FIGS. 4-8.

Each of the steps of the methods 400, 500, 600, 700, and 800, shown in FIGS. 4-8, respectively, may be performed by any suitable component of the operating environment. For example, in various embodiments, one or more of the methods 400, 500, 600, 700, and 800 may be partially or entirely performed by a processing circuit, a controller, a tape drive, or some other device having one or more processors therein. The processing circuit, e.g., processor(s), chip(s), and/or module(s) implemented in hardware and/or software with connections therebetween, and preferably having at least one hardware component, may be utilized in any device to perform one or more steps of the methods 400, 500, 600, 700, and 800. Illustrative processing circuits include, but are not limited to, a CPU, a microprocessor, an ASIC, a FPGA, etc., combinations thereof, or any other suitable computing device known in the art.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an ASIC, a FPGA, etc. By executable by the processor, what is meant is that the logic is hardware logic, software logic such as firmware, part of an operating system, part of an application program, etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a CPU, an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:
a processing circuit and logic integrated with the processing circuit executable by the processing circuit, or integrated with and executable by the processing circuit, the logic being configured to cause the processing circuit to:
read a codeword stored to a memory, wherein the codeword is a vector of binary symbols having a predetermined length, wherein the codeword of length n bits is encoded from a linear block code applied to a data word of length k bits, wherein the linear block code is configured to provide m+1 bits of parity for each data word, with $n=2^m-u$, $k=2^m-1-m-u$, and wherein m and u are user selectable positive integer parameters;
compute a syndrome word based on a product of the codeword and a parity check matrix derived from the linear block code;
set a flag to a first value indicating that the codeword includes no errors in response to a first determination requiring that the syndrome word is an all-zero vector;
set the flag to a second value indicating that the codeword includes exactly one single-bit error in response to a second determination requiring that the syndrome word equals a column of the parity check matrix;
set the flag to a third value indicating that the codeword includes an odd number of multiple bit errors in response to a third determination;
set the flag to a fourth value indicating that the codeword includes an even number of multiple bit errors in response to a fourth determination; and
output the flag corresponding to an estimated number of bit errors in the codeword.

2. The system as recited in claim 1, wherein the logic further causes the processing circuit to:
produce and output an estimated data word based on the codeword and the estimated number of bit errors in the codeword in response to determining that the syndrome word is an all-zero vector.

3. The system as recited in claim 1, wherein the logic further causes the processing circuit to, in response to determining that the syndrome word equals the column of the parity check matrix:
correct the single-bit error by adding an estimated error word to the codeword;
produce an estimated data word based on the codeword; and
output the estimated data word.

4. The system as recited in claim 1, wherein the parity check matrix has (n-k) linearly independent rows and n columns, wherein no column in the parity check matrix is an all-zero vector, wherein no two columns added together from the parity check matrix equal another column from the parity check matrix, and wherein a row having all values of one for each element thereof is obtainable by adding a select group of rows from the parity check matrix.

5. The system as recited in claim 4,
wherein the third determination requires that the syndrome word is equal to a sum of three columns from the parity check matrix, wherein the third value indicates that the codeword includes exactly three bit errors,
wherein the fourth determination requires that the syndrome word is equal to a sum of two columns in the parity check matrix, wherein the fourth value indicates that the codeword includes exactly two bit errors,
wherein the logic further causes the processing circuit to:
set the flag to a fifth value in response to a fifth determination requiring that the syndrome word is equal to a sum of columns greater than or equal to three in quantity and odd from the parity check matrix but does not equal a sum of three columns from the parity check matrix, wherein the fifth value indicates that the codeword includes an odd number of bit errors numbering five or greater; and
set the flag to a sixth value in response to a sixth determination requiring absence of the first, second, third, fourth, or fifth determinations, wherein the sixth value indicates that the codeword includes an even number of bit errors greater than or equal to four.

6. The system as recited in claim 4,
wherein the third determination requires that the syndrome word is equal to a sum of three columns in the parity check matrix, wherein the third value indicates that the codeword includes exactly three bit errors; and
wherein the fourth determination requires absence of the first, second, or third determinations, wherein the fourth value indicates that the codeword includes exactly two bit errors.

7. The system as recited in claim 1, wherein:
the third determination includes a determination that the syndrome word is equal to a sum of columns greater than or equal to three in quantity and odd from the parity check matrix,
the fourth determination includes a determination of an absence of the first, second, or third determinations, and
setting the flag to the third value or the fourth value is used to indicate one or more bad modules within a memory subsystem.

8. The system as recited in claim 1, wherein the parity check matrix has (n−k) linearly independent rows and n columns, wherein a last element of each column from the parity check matrix equals one, and wherein a first n−k−1 elements of any two columns from the parity check matrix are not equivalent.

9. The system as recited in claim 8, wherein the third determination requires that a last element of the syndrome word is equal to one, wherein the third value indicates that the codeword includes three bit errors, wherein the fourth determination requires absence of the first, second, or third determinations, and wherein the fourth value indicates that the codeword includes two bit errors.

10. The system as recited in claim 1, wherein the parity check matrix has (n−k) linearly independent rows and n columns, wherein no column in the parity check matrix is an all-zero vector, wherein no two columns from the parity check matrix are equivalent, and wherein an odd number of elements in each column of the parity check matrix equal one.

11. The system as recited in claim 10, wherein the third determination requires that binary summation of all elements in the syndrome word equals one, wherein the third value indicates that the codeword includes three bit errors, wherein the fourth determination requires absence of the first, second, or third determinations, and wherein the fourth value indicates that the codeword includes two bit errors.

12. A computer program product, the computer program product comprising a computer readable storage medium having program instructions embodied therewith, wherein the computer readable storage medium is not a transitory signal per se, the program instructions executable by a processing circuit to cause the processing circuit to:
  read, by the processing circuit, a codeword stored to a memory, wherein the codeword is a vector of binary symbols having a predetermined length, wherein the codeword of length n bits is encoded from a linear block code applied to a data word of length k bits, wherein the linear block code is configured to provide m+1 bits of parity for each data word, with $n=2^m-u$, $k=2^m-1-m-u$, and wherein m and u are user selectable positive integer parameters;
  compute, by the processing circuit, a syndrome word based on a product of the codeword and a parity check matrix derived from the linear block code;
  set, by the processing circuit, a flag to a first value indicating that the codeword includes no errors in response to a first determination requiring that the syndrome word is an all-zero vector;
  set, by the processing circuit, the flag to a second value indicating that the codeword includes exactly one single-bit error in response to a second determination requiring that the syndrome word equals a column of the parity check matrix;
  set, by the processing circuit, the flag to a third value indicating that the codeword includes an odd number of multiple bit errors in response to a third determination;
  set, by the processing circuit, the flag to a fourth value indicating that the codeword includes an even number of multiple bit errors in response to a fourth determination; and
  output, by the processing circuit, the flag corresponding to an estimated number of bit errors in the codeword.

13. The computer program product as recited in claim 12, wherein the program instructions are further executable by the processing circuit to cause the processing circuit to:
  produce, by the processing circuit, an estimated data word based on the codeword and the estimated number of bit errors in the codeword in response to the first determination or the second determination;
  output, by the processing circuit, the estimated data word in response to the first determination or the second determination; and
  correct, by the processing circuit, the single-bit error by adding an estimated error word to the codeword in response to the second determination prior to outputting the estimated data word.

14. The computer program product as recited in claim 12, wherein the parity check matrix has (n−k) linearly independent rows and n columns, wherein no column in the parity check matrix is an all-zero vector, wherein no two columns added together from the parity check matrix equal another column from the parity check matrix, wherein a row having all values of one for each element thereof is obtainable by adding a select group of rows from the parity check matrix, wherein the third determination requires that the syndrome word is equal to a sum of columns greater than or equal to three in quantity and odd from the parity check matrix, wherein the third value indicates that the codeword includes an odd number of bit errors greater than one, wherein the fourth determination requires absence of the first, second, or third determinations, and wherein the fourth value indicates that the codeword includes an even number of bit errors.

15. The computer program product as recited in claim 12, wherein the parity check matrix has (n−k) linearly independent rows and n columns, wherein a last element of each column from the parity check matrix equals one, wherein a first n−k−1 elements of any two columns from the parity check matrix are not equivalent, wherein the third determination requires that a last element of the syndrome word is equal to one, wherein the third value indicates that the codeword includes three bit errors, wherein the fourth determination requires absence of the first, second, or third determinations, and wherein the fourth value indicates that the codeword includes two bit errors.

16. The computer program product as recited in claim 12, wherein the parity check matrix has (n−k) linearly independent rows and n columns, wherein no column in the parity check matrix is an all-zero vector, wherein no two columns from the parity check matrix are equivalent, wherein an odd number of elements in each column of the parity check matrix equal one, wherein the third determination requires that binary summation of all elements in the syndrome word equals one, wherein the third value indicates that the codeword includes three bit errors, wherein the fourth determination requires absence of the first, second, or third determinations, and wherein the fourth value indicates that the codeword includes two bit errors.

17. A computer-implemented method, the method comprising:
  reading a codeword stored to a memory, wherein the codeword is a vector of binary symbols having a predetermined length, wherein the codeword of length n bits is encoded from a linear block code applied to a data word of length k bits, wherein the linear block code is configured to provide m+1 bits of parity for each data word, with $n=2^m-u$, $k=2^m-1-m-u$, and wherein m and u are user selectable positive integer parameters;
  computing a syndrome word based on a product of the codeword and a parity check matrix derived from the linear block code;

setting a flag to a first value indicating that the codeword includes no errors in response to a first determination requiring that the syndrome word is an all-zero vector;

setting the flag to a second value indicating that the codeword includes exactly one single-bit error in response to a second determination requiring that the syndrome word equals a column of the parity check matrix;

setting the flag to a third value indicating that the codeword includes an odd number of multiple bit errors in response to a third determination;

setting the flag to a fourth value indicating that the codeword includes an even number of multiple bit errors in response to a fourth determination; and outputting the flag corresponding to an estimated number of bit errors in the codeword.

18. The method as recited in claim 17, further comprising:

producing an estimated data word based on the codeword and the estimated number of bit errors in the codeword in response to the first determination or the second determination;

outputting the estimated data word in response to the first determination or the second determination; and correcting the single-bit error by adding an estimated error word to the codeword in response to the second determination prior to outputting the estimated data word.

19. The method as recited in claim 17, wherein the parity check matrix has (n–k) linearly independent rows and n columns, wherein no column in the parity check matrix is an all-zero vector, wherein no two columns added together from the parity check matrix equal another column from the parity check matrix, wherein a row having all values of one for each element thereof is obtainable by adding a select group of rows from the parity check matrix, wherein the third determination requires that the syndrome word is equal to a sum of columns greater than or equal to three in quantity and odd from the parity check matrix, wherein the third value indicates that the codeword includes an odd number of bit errors greater than one, wherein the fourth determination requires absence of the first, second, or third determinations, and wherein the fourth value indicates that the codeword includes an even number of bit errors.

20. The method as recited in claim 17, wherein the parity check matrix has (n–k) linearly independent rows and n columns, wherein a last element of each column from the parity check matrix equals one, wherein a first n–k–1 elements of any two columns from the parity check matrix are not equivalent, wherein the third determination requires that a last element of the syndrome word is equal to one, wherein the third value indicates that the codeword includes three bit errors, wherein the fourth determination requires absence of the first, second, or third determinations, and wherein the fourth value indicates that the codeword includes two bit errors.

21. The method as recited in claim 17, wherein the parity check matrix has (n-k) linearly independent rows and n columns, wherein no column in the parity check matrix is an all-zero vector, wherein no two columns from the parity check matrix are equivalent, wherein an odd number of elements in each column of the parity check matrix equal one, wherein the third determination requires that binary summation of all elements in the syndrome word equals one, wherein the third value indicates that the codeword includes three bit errors, wherein the fourth determination requires absence of the first, second, or third determinations, and wherein the fourth value indicates that the codeword includes two bit errors.

22. A system, comprising:

a processing circuit and logic integrated with the processing circuit, executable by the processing circuit, or integrated with and executable by the processing circuit, the logic being configured to cause the processing circuit to:

read a codeword stored to a memory, wherein the codeword is a vector of binary symbols having a predetermined length, wherein the codeword of length n bits is encoded from a linear block code applied to a data word of length k bits, wherein the linear block code is configured to provide m+1 bits of parity for each data word, with $n=2^m-u$, $k=2^m-1-m-u$, and wherein m and u are user selectable positive integer parameters;

compute a syndrome word based on a product of the codeword and a parity check matrix derived from the linear block code, wherein the parity check matrix has (n–k) linearly independent rows and n columns, wherein a last element of each column from the parity check matrix equals one, and wherein a first n–k–1 elements of any two columns from the parity check matrix are not equivalent;

set a flag to a first value indicating that the codeword includes no errors in response to a first determination requiring that the syndrome word is an all-zero vector;

set the flag to a second value indicating that the codeword includes exactly one single-bit error in response to a second determination requiring that the syndrome word equals a column of the parity check matrix;

set the flag to a third value indicating that the codeword includes an odd number of multiple bit errors in response to a third determination requiring that a last element of the syndrome word is equal to one, wherein the third value indicates that the codeword includes three bit errors;

set the flag to a fourth value indicating that the codeword includes an even number of multiple bit errors in response to a fourth determination requiring absence of the first, second, or third determinations, wherein the fourth value indicates that the codeword includes two bit errors;

output the flag corresponding to an estimated number of bit errors in the codeword;

produce an estimated data word based on the codeword and the estimated number of bit errors in the codeword in response to the first determination or the second determination; and output the estimated data word in response to the first determination or the second determination.

23. The system as recited in claim 22, wherein the logic further causes the processing circuit to:

correct the single-bit error by adding an estimated error word to the codeword in response to the second determination prior to outputting the estimated data word.

24. A system, comprising:

a processing circuit and logic integrated with the processing circuit, executable by the processing circuit, or integrated with and executable by the processing circuit, the logic being configured to cause the processing circuit to:

read a codeword stored to a memory, wherein the codeword is a vector of binary symbols having a predetermined length, wherein the codeword of length n bits is encoded from a linear block code applied to a data word of length k bits, wherein the linear block code is configured to provide m+1 bits of parity for each data word, with $n=2^m-u$, $k=2^m-1-m-u$, and wherein m and u are user selectable positive integer parameters;

compute a syndrome word based on a product of the codeword and a parity check matrix derived from the linear block code, wherein the parity check matrix has (n−k) linearly independent rows and n columns, wherein no column in the parity check matrix is an all-zero vector, wherein no two columns from the parity check matrix are equivalent, and wherein an odd number of elements in each column of the parity check matrix equal one;

set a flag to a first value indicating that the codeword includes no errors in response to a first determination requiring that the syndrome word is an all-zero vector;

set the flag to a second value indicating that the codeword includes exactly one single-bit error in response to a second determination requiring that the syndrome word equals a column of the parity check matrix;

set the flag to a third value indicating that the codeword includes an odd number of multiple bit errors in response to a third determination requiring that binary summation of all elements in the syndrome word equals one, wherein the third value indicates that the codeword includes three bit errors;

set the flag to a fourth value indicating that the codeword includes an even number of multiple bit errors in response to a fourth determination requiring absence of the first, second, or third determinations, wherein the fourth value indicates that the codeword includes two bit errors; and output the flag corresponding to an estimated number of bit errors in the codeword.

25. The system as recited in claim 24, wherein the logic further causes the processing circuit to:

produce an estimated data word based on the codeword and the estimated number of bit errors in the codeword in response to the first determination or the second determination;

output the estimated data word in response to the first determination or the second determination; and correct the single-bit error by adding an estimated error word to the codeword in response to the second determination prior to outputting the estimated data word.

* * * * *